(12) United States Patent
Wu et al.

(10) Patent No.: US 10,678,146 B2
(45) Date of Patent: Jun. 9, 2020

(54) PARTICLE REMOVAL FROM WAFER TABLE AND PHOTOMASK

(71) Applicant: TAIWAN SEMICONDUCTOR MANUFACTURING CO., LTD., Hsinchu (TW)

(72) Inventors: Min-Cheng Wu, Taitung County (TW); Chi-Hung Liao, New Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/164,652

(22) Filed: Oct. 18, 2018

(65) Prior Publication Data

US 2020/0019072 A1   Jan. 16, 2020

Related U.S. Application Data

(60) Provisional application No. 62/698,277, filed on Jul. 15, 2018.

(51) Int. Cl.
*G03B 27/52* (2006.01)
*G03B 27/42* (2006.01)
(Continued)

(52) U.S. Cl.
CPC ............ *G03F 7/70733* (2013.01); *G03F 1/82* (2013.01)

(58) Field of Classification Search
CPC .. B08B 3/024; B08B 3/10; B08B 1/02; B08B 3/022; B08B 3/12; B08B 1/001; B08B 3/02; B08B 3/041; B08B 1/007; B08B 7/0014; B08B 7/04; B08B 11/00; B08B 11/02; B08B 3/00; B08B 5/00; B08B 5/02; B08B 1/00; B08B 1/006; B08B 3/04; B08B 3/102; B08B 7/0035; B08B 7/0057; B08B 9/00; B08B 15/007; B08B 15/023; B08B 15/04; B08B 17/025; B08B 1/003; B08B 2209/005; B08B 3/14; B08B 7/00; B08B 7/0021; B08B 7/02; B08B 7/028; B08B 9/027; B08B 9/205; B08B 9/28; H01L 21/67051; H01L 21/67046; H01L 21/02057; H01L 21/67028; H01L 21/02052; H01L 21/304; H01L 21/02041; H01L 21/67219; H01L 21/68764; H01L 21/02087; H01L 21/0209; H01L 21/02101;
(Continued)

(56) References Cited

U.S. PATENT DOCUMENTS 7,169,469 B2   1/2007   Liu et al.
2002/0109828 A1*  8/2002   Moors ................. G03F 7/70558
                                                    355/76

(Continued)

FOREIGN PATENT DOCUMENTS

TW   200529349 A   9/2005
TW   201331721 A   8/2013

*Primary Examiner* — Mesfin T Asfaw
(74) *Attorney, Agent, or Firm* — Maschoff Brennan

(57) ABSTRACT

A method includes moving a sticky structure to a wafer table such that a first particle on the wafer table is adhered to the sticky structure, moving the sticky structure away from the wafer table after the first particle is adhered to the sticky structure, and performing a lithography process to a wafer held by the wafer table after moving the sticky structure away from the wafer table.

20 Claims, 32 Drawing Sheets

(51) Int. Cl.
*G03F 7/20* (2006.01)
*G03F 1/82* (2012.01)

(58) Field of Classification Search
CPC ......... H01L 21/30625; H01L 21/31133; H01L 21/6704; H01L 21/02096; H01L 21/6708; H01L 21/67086; H01L 21/02076; H01L 21/02082; H01L 21/02334
See application file for complete search history.

(56) References Cited

U.S. PATENT DOCUMENTS

2003/0092365 A1* 5/2003 Grube .................. B08B 7/0028
 451/178
2004/0130692 A1* 7/2004 Tanaka .................. G03F 7/707
 355/53

* cited by examiner

PARTICLE REMOVAL FROM WAFER TABLE AND PHOTOMASK

PRIORITY CLAIM AND CROSS-REFERENCE

This application claims priority to U.S. Provisional Application Ser. No. 62/698,277, filed Jul. 15, 2018, which is herein incorporated by reference.

BACKGROUND

The fabrication of integrated circuits ("IC") devices involves the performance of a range of processing steps. In particular, patterned layers of various materials are applied to a substrate to create the desired device. The patterns of the layers are accurately aligned to ensure proper operation of the resultant circuit. Misalignment of the layers will degrade the performance of the IC. As IC designs have become increasingly complex, the critical dimensions ("CDs") thereof have been correspondingly reduced, resulting in a reduction in acceptable relative displacement of the various IC device layers.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
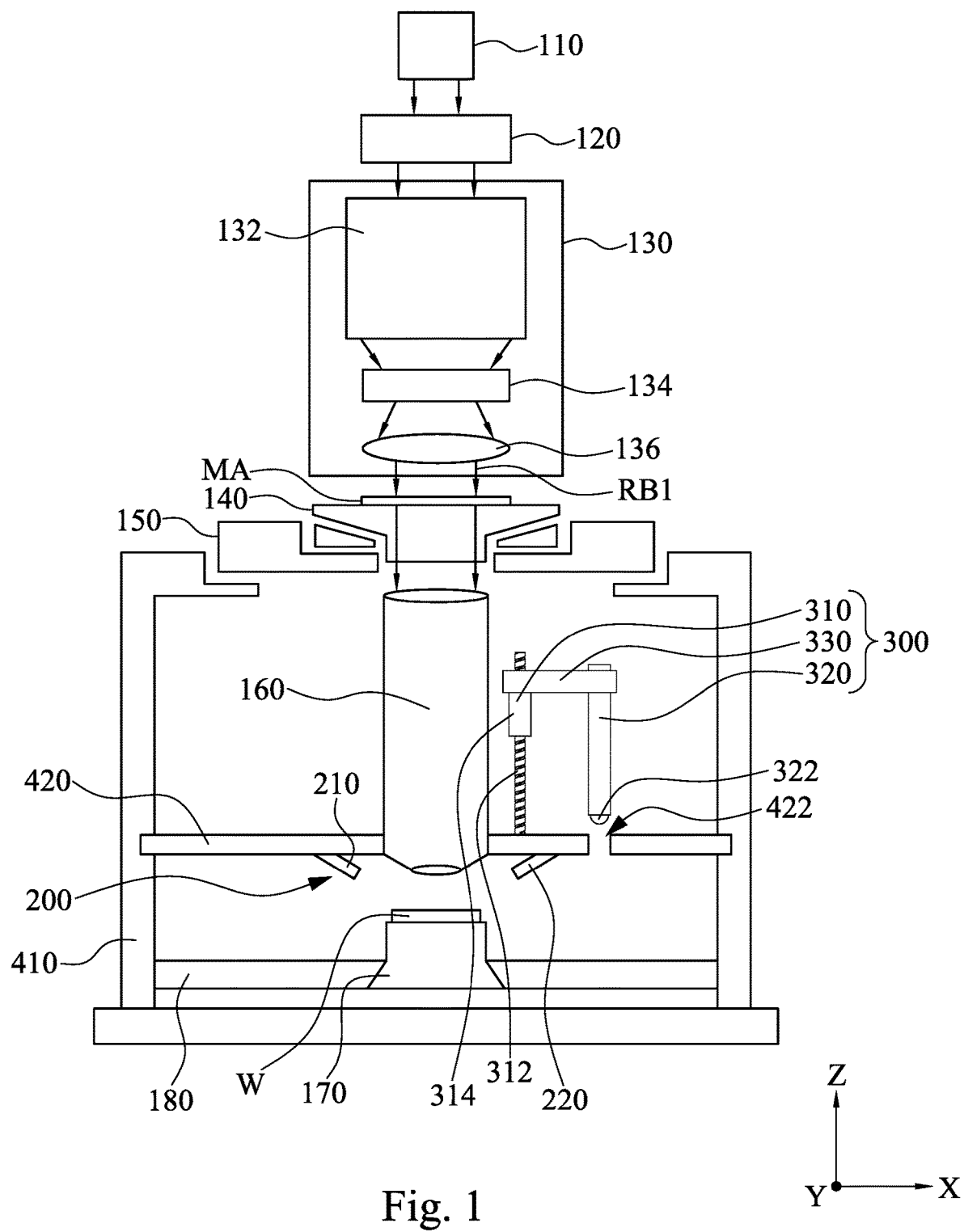
FIG. 1 schematically illustrates a lithographic apparatus according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As the scaling down process continues to advance, alignment and overlay issues in lithography process becomes more challenging due to the ever-decreasing device sizes. A small alignment or overlay error during fabrication may lead to the failure of a wafer. Various devices and techniques have been utilized to minimize misalignment during fabrication. For example, alignment marks may be used to ensure correct alignment between wafers as they are loaded into a semiconductor fabrication tool. As another example, a wafer leveling system may be used to ensure the wafer is flat during fabrication. However, particles generated by various fabrication processes may still cause alignment problems for semiconductor fabrication processes, particularly if these particles are located on a wafer table or a photomask (also referred to as reticle). Therefore, embodiments of the present disclosure provide a clean device to remove particles from the wafer table and/or the photomask.

FIG. 1 schematically illustrates a lithographic apparatus according to some embodiments of the present disclosure. The apparatus includes an illumination system (illuminator) 130 configured to condition a radiation beam RB1 (e.g., UV radiation or any other suitable radiation), a support structure (e.g., a photomask table) 140 constructed to support a patterning device (e.g., a photomask) MA and connected to a first positioning device (also referred to as a photomask positioning device) 150 configured to accurately position the patterning device MA in accordance with certain parameters. The apparatus also includes a substrate table (e.g., a wafer table) 170 or "substrate support" constructed to hold a substrate (e.g., a resist-coated wafer) W and connected to a second positioning device (also referred to as a wafer positioning device) 180 configured to accurately position the substrate W in accordance with certain parameters. In some embodiments, the wafer table 170 can be referred to as a holding device because it can hold the wafer W. The apparatus further includes a projection system (e.g., a refractive projection lens system) 160 configured to project a pattern imparted to the radiation beam RB1 by patterning device MA onto a target place of the substrate W.

In some embodiments, the illumination system 130 may include various types of optical components, such as refractive, reflective, magnetic, electromagnetic, electrostatic or other types of optical components, or any combination thereof, for directing, shaping, or controlling radiation beam RB1.

The support structure 140 supports, i.e., bears the weight of, the patterning device MA. In some embodiments, the support structure 140 can use mechanical, vacuum, electrostatic or other clamping techniques to hold the patterning device MA. The support structure 140 may be a frame or a table, for example, which may be fixed or movable. The support structure 140 may ensure that the patterning device MA is at a desired position, for example with respect to the projection system 160.

In some embodiments, the patterning device MA is any device that can be used to impart a radiation beam with a pattern in its cross-section so as to create a pattern in the substrate W (i.e., wafer). It is noted that the pattern imparted to the radiation beam RB1 may not exactly correspond to the desired pattern in the substrate W, for example if the pattern includes phase-shifting features. Generally, the pattern imparted to the radiation beam RB1 will correspond to a particular functional layer in a device being created in the substrate W, such as an integrated circuit.

The patterning device MA may be transmissive or reflective. Examples of patterning devices MA include photomasks (also referred to as reticles), programmable mirror arrays, and programmable LCD panels. Masks include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

In some embodiments, the projection system 160 is any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum.

As here depicted, the lithographic apparatus is of a transmissive type (e.g., employing a transmissive photomask). Alternatively, the lithographic apparatus may be of a reflective type (e.g., employing a programmable mirror array, or employing a reflective photomask).

The lithographic apparatus may be of a type having two (dual stage) or more substrate tables or "substrate supports" (and/or two or more photomask tables or "photomask supports"). In such "multiple stage" machines, the additional tables or supports may be used in parallel, or preparatory steps may be carried out on one or more tables or supports while one or more other tables or supports are being used for exposure.

The lithographic apparatus may also be of a type wherein at least a portion of the substrate W may be covered by a liquid having a relatively high refractive index, e.g., water, so as to fill a space between the projection system 160 and the substrate W. An immersion liquid may also be applied to other spaces in the lithographic apparatus, for example, between the photomask MA and the projection system 160. Immersion techniques can be used to increase the numerical aperture of projection systems. The term "immersion" as used herein does not mean that the substrate W must be submerged in liquid, but rather only means that a liquid is located between the projection system 160 and the substrate W during exposure.

Referring to FIG. 1, the illuminator 130 receives a radiation beam RB1 from a radiation source 110. The radiation source and the lithographic apparatus may be separate entities, for example when the radiation source is an excimer laser. In such cases, the radiation source 110 is not considered to form part of the lithographic apparatus and the radiation beam RB1 is passed from the source 110 to the illuminator 130 with the aid of a beam delivery system 120 including, for example, suitable directing mirrors and/or a beam expander. In other cases, the radiation source 110 may be an integral part of the lithographic apparatus, for example when the radiation source 110 is a mercury lamp. The source 110 and the illuminator 130, together with the optional beam delivery system 120, may be referred to as a radiation system.

In some embodiments, the illuminator 130 may include an adjuster 132 configured to adjust the angular intensity distribution of the radiation beam RB1. Generally, at least the outer and/or inner radial extent (commonly referred to as σ-outer and σ-inner, respectively) of the intensity distribution in a pupil plane of the illuminator 130 can be adjusted. In addition, the illuminator 130 may include various other components, such as an integrator 134 and a condenser 136. The illuminator 130 may be used to condition the radiation beam RB1, to have a desired uniformity and intensity distribution.

The radiation beam RB1 is incident on the photomask MA, which is held on the photomask positioning device 150, and is patterned by the photomask MA. Having traversed the photomask MA, the radiation beam RB1 passes through the projection system 160, which focuses the radiation beam RB1 onto a target portion of the wafer W on the wafer table 170. With the aid of the wafer positioning device 180, the wafer table 170 can be moved accurately, e.g., so as to position different target portions of the wafer in the path of the radiation beam RB1. Similarly, the photomask positioning device 150 can be used to accurately position the photomask MA with respect to the path of the radiation beam RB1, e.g., after mechanical retrieval from a photomask library, or during a scan. In general, movement of the photomask table 140 may be realized with the aid of a long-stroke module (coarse positioning) and a short-stroke module (fine positioning), which form part of the photomask positioning device 150. Similarly, movement of the wafer table 170 may be realized using the wafer positioning device 180. In the case of a stepper (as opposed to a scanner), the photomask table 140 may be connected to a short-stroke actuator only, or may be fixed. Photomask MA on the photomask table 140 and the wafer W on the wafer table 170 may be aligned using photomask alignment marks on the photomask MA and wafer alignment marks on the wafer W.

Figure 2:
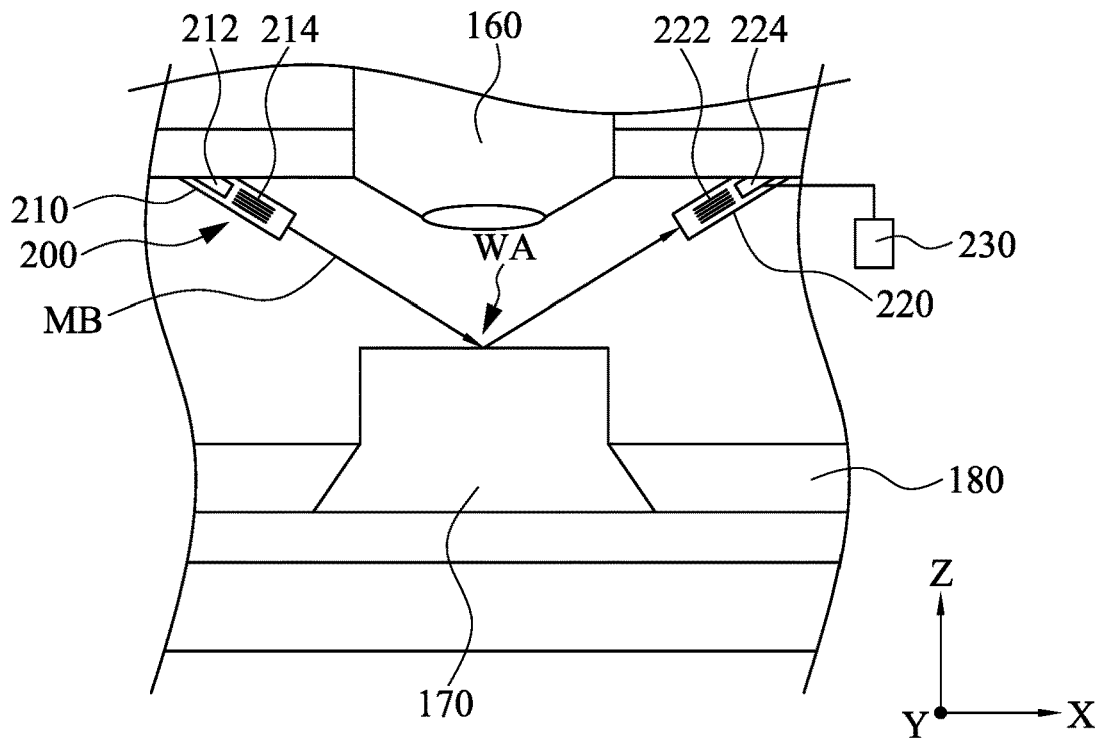
FIGS. 2 and 3 show exemplary particle identification using an exemplary level sensor in accordance with some embodiments of the present disclosure.
Figure 3:
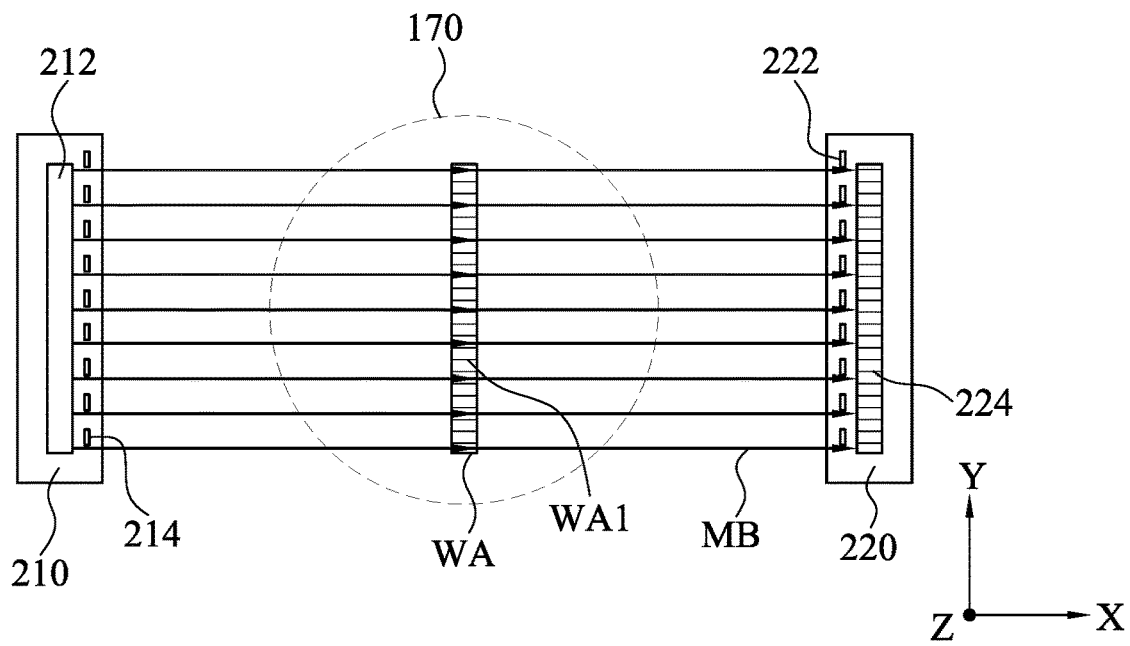

In some embodiments, the apparatus further includes a level sensor 200 that can determine a height map of a top surface of the wafer W. This height map of the wafer W may be used to correct the position of the wafer W during projection of a pattern on the wafer W. Moreover, the level sensor 200 can be also used to measure heights of various portions of the top surface of the wafer table 170, so as to identify particles on the top surface of the wafer table 170. FIGS. 2 and 3 show exemplary particle identification using an exemplary level sensor 200, wherein FIG. 2 is a schematic side view, and FIG. 3 is a schematic bottom view. The level sensor 200 can determine a height map on the wafer table 170. Because the height variation on the wafer table 170 results from particles distributed on the wafer table 170, the height map can be in turn used to identify particles on the wafer table 170 and thus be used to generate a particle map. In some embodiments, the level sensor 200 may be arranged in a stand-alone device, or integrated in a lithographic apparatus similar to the lithographic apparatus as shown in FIG. 1.

In some embodiments, the level sensor 200 includes a projection unit 210, a detection unit 220 and a processing unit 230. In some embodiments, the projection unit 210 comprises a light source 212 and a projection grating 214. The light source 212 may be, for example, a broadband light source but a polarized or non-polarized laser beam can also be used. The light source 212 provides a measurement beam MB, which is directed to the projection grating 214. The projection grating 214 comprises a pattern resulting in a patterned measurement beam MB.

In some embodiments, the wafer table 170 and/or the level sensor 200 may be moved with respect to each other to align different measurement areas WA on wafer table 170 with the measurement beam MB. For example, the wafer table 170 may be moved with respect to the level sensor 200 by using movement of the wafer positioning device 180. In some embodiments, a single light source covers the whole measurement area WA. In alternative embodiments, two or more light sources may be provided to cover the measurement area WA.

The detection unit 220 is arranged to receive the measurement beam MB after reflection on the wafer table 170. In some embodiments, the detection unit 220 includes a detection grating 222 and at least a one-dimensional array of detection elements 224, for example a CMOS or CCD sensor. In some embodiments, the one-dimensional array of detection elements 224 may be a continuous array of detection elements made up by a single CMOS or CCD sensor. The array may for instance comprise a row of 1024 pixels, each pixel forming a detection element 224. A continuous array may have the advantage that all detection elements 224, for example pixels, are arranged adjacent to each other and fit together so that there is less light loss between the detection elements 224, and as a result also less information loss with respect to the height of the surface area of the wafer table 170 within the measurement area WA.

As illustrated in FIG. 3, each detection element 224 is associated with a measurement subarea WA1 of the measurement area WA, i.e., the detection element 224 receives a part of the measurement beam MB reflected by the respective measurement subarea WA1 of the measurement area WA. Thus, the amount of light received by a detection element 224 relates to a height level of the associated measurement subarea WA1 on the wafer table 170.

The detection grating 222 is arranged to receive, at least partly, the measurement beam MB, and the light of the measurement beam MB transmitted by the detection grating 222 will be received by the detection elements 224. The detection elements 224 are each configured to provide a measurement signal based on the amount of light received by the respective detection element 224. The measurement signals generated from the detection elements 224 are fed to the processing unit 230.

The processing unit 230 is configured to calculate a height level within the measurement area WA based on the measurement signals generated from the detection elements 224. Each detection element 224 is associated with a measurement subarea WA1 of the measurement area WA. Thus, each detection element 224 can be used to determine a height level of the respective measurement subarea WA1 of the measurement area WA. When the processing unit 230 calculates a height level for each measurement subarea, a height map of the top surface of the wafer table 170 with high resolution can be obtained. Because the height variation of the wafer table results from particles on the wafer table 170, the processing unit 230 can identify particles on the wafer table 170 based on the calculated height map and thus generate a particle map. In some embodiments, the processing unit 230 is a central processing unit (CPU) in a computer or the like.

Figure 4:
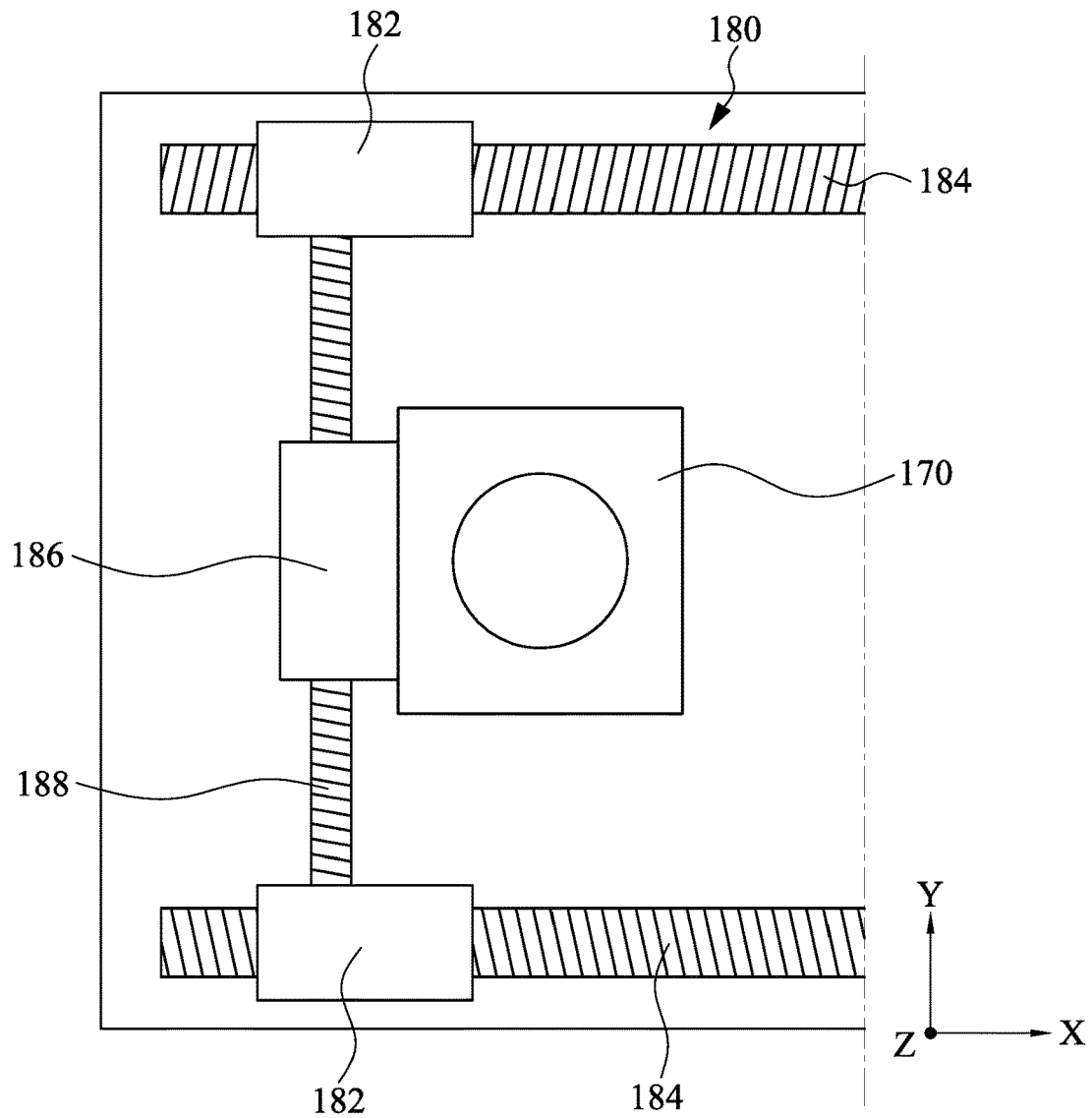
FIG. 4 illustrates an exemplary wafer positioning device in accordance with some embodiments of the present disclosure.

FIG. 4 illustrates an exemplary wafer positioning device 180 in accordance with some embodiments of the present disclosure. In some embodiments, the wafer positioning device 180 includes one or more first actuators 182 and one or more first guides 184. The one or more first actuators 182 are movable along respective first guides 184 that extend in X-direction. Moreover, the wafer positioning device 180 further comprises a second actuator 186 and a second guide 188. The second guide 188 is connected between the first actuators 182 and extends in Y-direction. The second actuator 186 is movable along the second guide 188. The wafer table 170 is fixed to the second actuator 186. In this way, the wafer positioning device 180 can move or transport the wafer table 170 either in X-direction or in Y-direction. The wafer positioning device 180 can thus referred to as a transportation device in some embodiments. In some embodiments, the actuators 182 and/or 186 may include any type of positioning actuator, such as a piezo-electric actuator, a pneumatic actuator, a linear motor, a Lorentz actuator, a cam disk or a spindle.

Movement of the wafer table 170 using the transportation device 180 not only allows the level sensor 200 to obtain the particle map from an entire top surface of the wafer table 170, but also allows a cleaning operation to remove particles from the wafer table 170 using a particle removal device 300 as shown in FIG. 1.

The particle removal device 300 includes a motion actuator 310 and a cleaner 320 fixed to the motion actuator 310 via a cantilever 330. The cleaner 320 has a sticky structure 322 to which particles can be adhered. For example, the sticky structure 322 may be made of polyimide, kaoline or other sticky materials. As a result, when the transportation device 180 moves the wafer table 170 is to a position vertically below the sticky structure 322, the cleaner 320 can be lowered to the wafer table 170 by the motion actuator 310, so that particles on the wafer table 170 can be adhered to the sticky structure 322.

In some embodiments, the motion actuator 310 refers generally to any type of machine or mechanism capable of actuating motion of the cantilever 330. For example, the motion actuator 310 may be a liner motor, a tubular electromagnetic actuator, a hydraulic actuator, a ball screw drive or the like.

In some embodiments where the motion actuator 310 is a linear motor, the linear motor 310 has a stator 312 and a reaction plate 314. The stator 312 is typically a three phase winding in a laminated iron core. When the stator 312 is energized from an AC power source, a traveling wave magnetic field is produced. The reaction plate 314 is the equivalent of a rotor in a rotary induction motor and comprises a sheet of conductive material often having a flat plate of backing material. The magnetic field produces a force that propels the reaction plate 314 linearly along the surface of the stator 312. Reversing two phases of the power supply reverses the direction of the magnetic wave and, thus, the reaction plate 314. In this way, the reaction plate 314 can perform a liner movement along the stator 312, which in turn will lift or lower the cleaner 320 fixed to the reaction plate 314. As a result, after the wafer table 170 is moved to a position vertically below the cleaner 320 by the transportation device 180, the cleaner 320 can be lowered such that the sticky structure 322 can be in contact with the top surface of the wafer table 170, so that particles on the top surface of the wafer table 170 can be adhered to the sticky structure 322.

In some embodiments, the stator 312 extends vertically. More particularly, the stator 312 is vertically elongated and has a length that is determined by the desired travel distance of the cleaner 320. The reaction plate 314 is attached to the stator 312 in such a manner that it is free to move relative thereto vertically along the stator 312. The position and movement of the reaction plate 314 relative to the stator 312 is determined by a controller, which will be explained in detail later.

Also shown in FIG. 1 are two frames: a reference frame 420, which is also known as a so-called "metrology" frame, and a base frame 410.

The reference frame 420 provides a reference surface with respect to which the wafer and/or the wafer table 170 is measured, and is mechanically isolated from the main apparatus structure. For example, the reference frame 420 is dynamically and thermally isolated from the base frame 410. The reference frame 420 supports sensitive components such as level sensor 200. Additionally, depending on the particular lithographic apparatus, the reference frame 420 may also support the projections system 160. Moreover, in some embodiments, the reference frame 420 supports the stator 312 of the linear motor 310.

In some embodiments, a bottom end of the stator 312 is fixed to a top surface of the reference frame 420, and the projection unit 210 and the detection unit 220 of the level sensor 200 is fixed to a bottom surface of the reference frame 420. In some embodiments, the reference frame 420 has a through hole 422 vertically below the cleaner 320. The through hole 422 has a diameter greater than a diameter of the bar-shaped cleaner 320, so that the bar-shaped cleaner 320 can pass through the through hole 422. In some other embodiments, the stator 312 is fixed to a bottom surface of the reference frame 420, and movement of the cleaner 320 is confined under the reference frame 420. In such embodiments, the through hole 422 can be omitted from the reference frame 420.

In some embodiments, the sticky structure 322 is a roller ball that is multi-directionally rotatable, so that the sticky structure 322 is free to roll when the sticky structure 322 is in contact with the wafer table 170. In this manner, the wafer table 170 can be horizontally moved (e.g., moved in the X-Y plane) by the transportation device 180 when the sticky structure 322 is in contact with the wafer table 170, so that the particles on different portions on the wafer table 170 can be adhered to the sticky roller ball 322.

Figure 5:
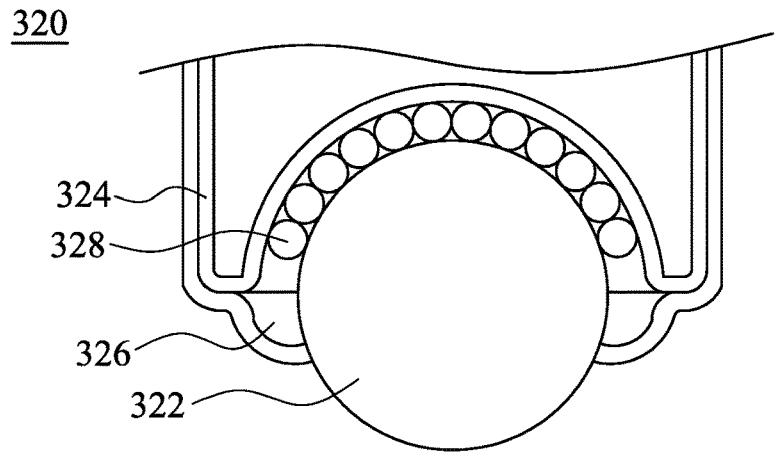
FIG. 5 is a cross-sectional view of a cleaner in accordance with some embodiments of the present disclosure.

An example of the roller ball structure is illustrated in a cross-sectional view of FIG. 5. In some embodiments, the cleaner 320 includes the sticky roller ball 322, a housing 324, a seal 326 and a plurality of bearing balls 328. The sticky roller ball 322 protrudes from the housing 324 but is sealed to it by the seal 326. A large number of small bearing balls 328 rotatably support the sticky roller ball 322 against a hemi-spherical surface of the housing 324. In some embodiments, the bearing balls 328 may be made of an anti-adhesive material or coated with an anti-adhesive layer, so as to prevent the bearing balls 328 from being adhered to the sticky roller ball 322, which in turn will facilitate free rolling of the sticky roller ball 322.

Figure 6:
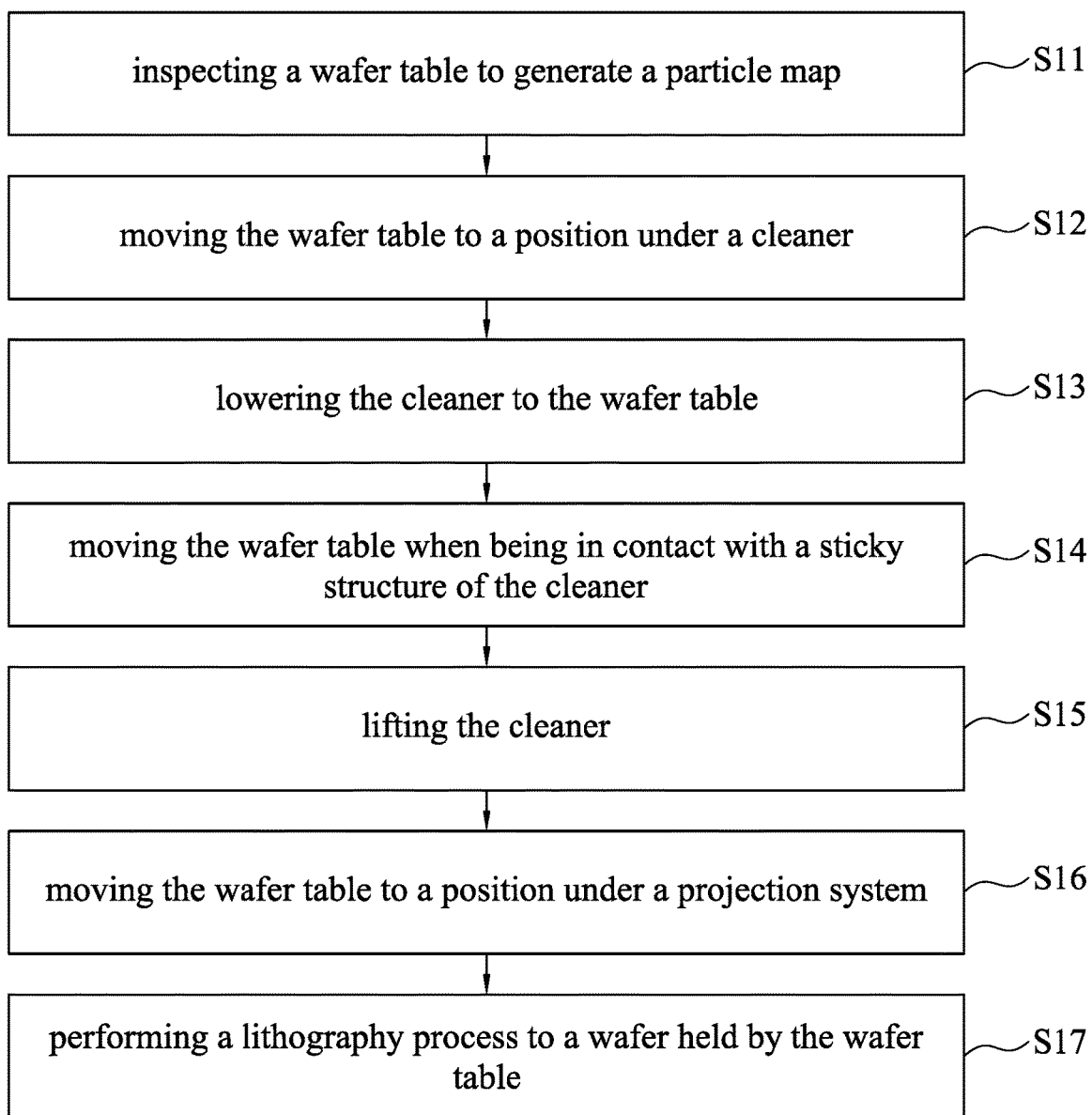
FIG. 6 is a flowchart of a wafer table cleaning method in accordance with some embodiments.

FIG. 6 is a flowchart of a wafer table cleaning method M1 in accordance with some embodiments. FIGS. 7-10 illustrate the wafer table cleaning method M1 at various stages in accordance with some embodiments. The wafer table cleaning method M1 may be implemented in a fab for fabricating a semiconductor device on a wafer using a photomask. It is understood that additional operations may be implemented before, during, and after the method M1, and some of the operations may be replaced, eliminated, or moved around for additional embodiments of the method M1.

Figure 7:
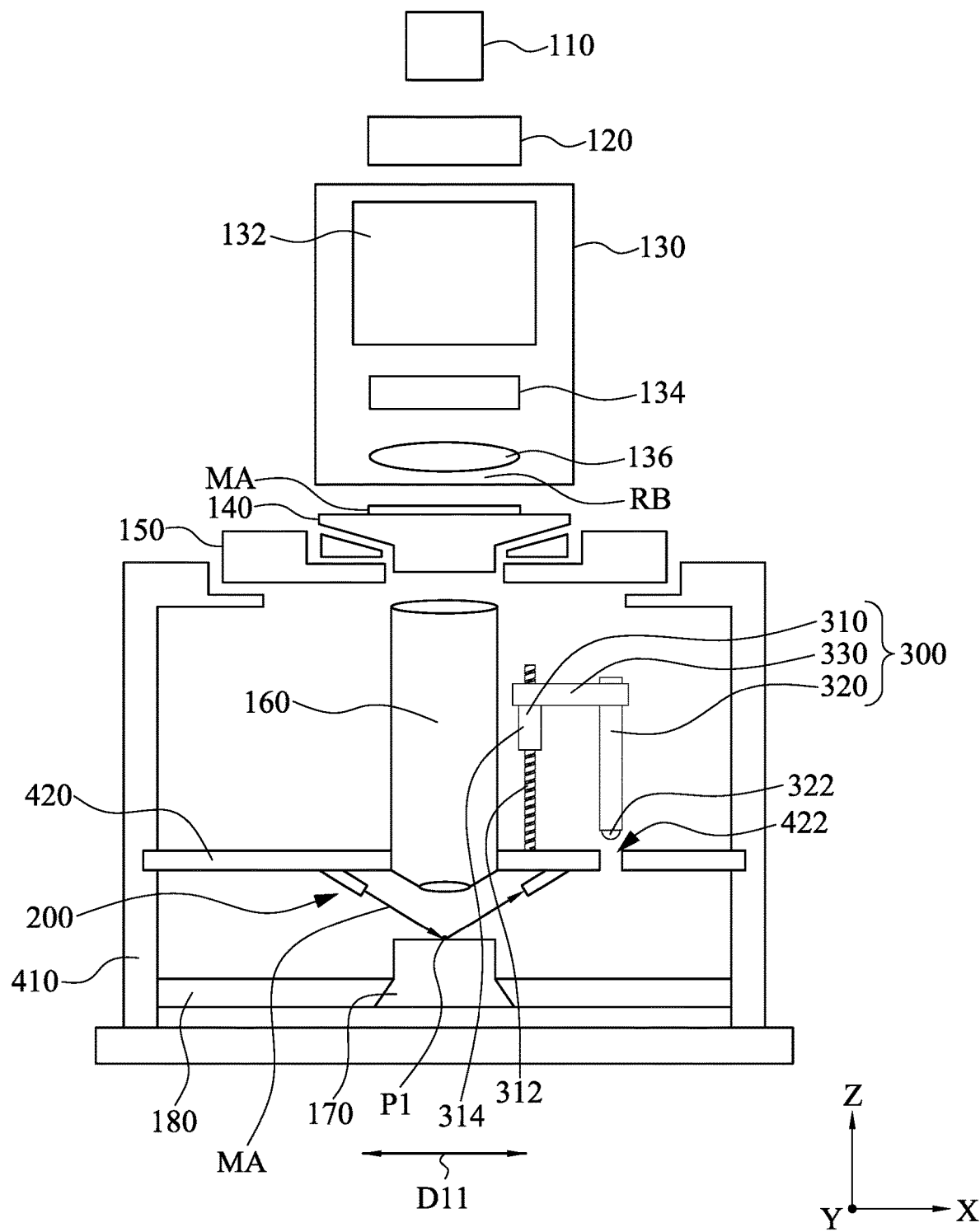
FIGS. 7-10 illustrate the wafer table cleaning method of FIG. 6 at various stages in accordance with some embodiments of the present disclosure.
Figure 11:
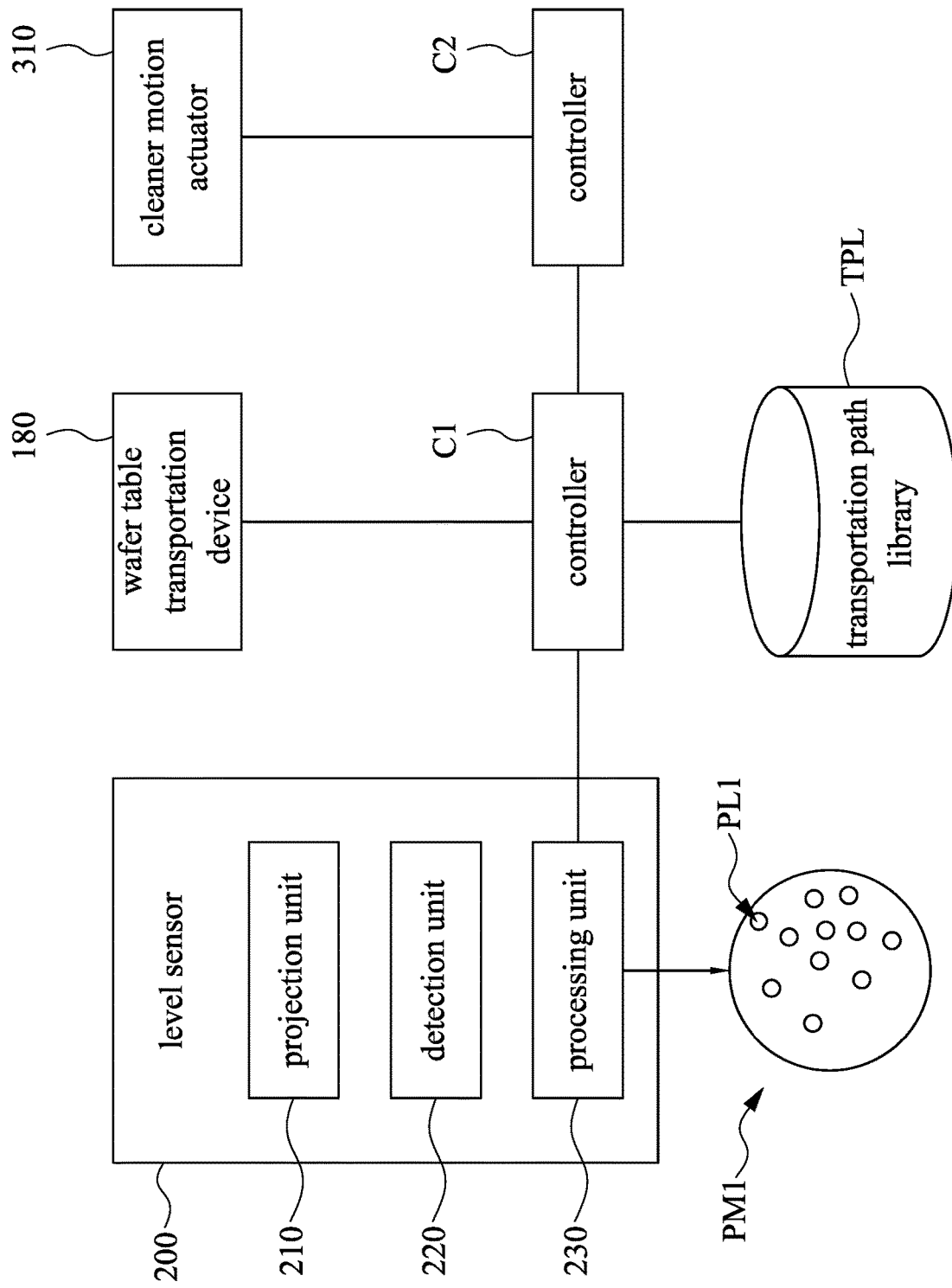
FIG. 11 is a block diagram associated with a wafer table method in accordance with some embodiments.

The method M1 begins at block S11 where the wafer table is inspected to generate a particle map. With reference to FIG. 7, in some embodiments, inspecting the wafer table 170 can be performed by the level sensor 200, as discussed previously with respect to FIG. 2. For example, the level sensor 200 can measure heights of various measurement areas on the wafer table 170, so as to identify particles P1 on the top surface of the wafer table 170 and thus generate a particle map PM1 showing one or more identified particle locations PL1, as illustrated in FIG. 11. For example, if the measured height of a measurement area is higher than a predetermined value, the processing unit 230 (See FIG. 2) can determine there are one or more particles on this measurement area. In some embodiments, during inspecting the wafer table 170, the wafer table 170 is moved either in X-direction (indicated by the double headed arrow D11 in FIG. 7) or in Y-direction using the transportation device 180 as illustrated in FIG. 4. Various measurement areas on the wafer table 170 are aligned with the measurement beam MB generated from the level sensor 200. In this way, the level sensor 200 can measure heights of various measurement areas on the wafer table 170, so as to inspect the entire top surface of the wafer table 170.

In some embodiments, the transportation device 180 is controlled by a controller C1, as illustrated in the block diagram of FIG. 11. The controller C1 is electrically connected to a transportation path library TPL that stores at least predetermined transportation paths P1 and P2. The predetermined transportation path P1 is a path that allows every measurement areas on the wafer table 170 to move to align with the measurement beam MB generated from the level sensor 200. The predetermined transportation path P2 is a path that allows the wafer table 170 to move from the position under the level sensor 200 to the position under the cleaner 320. In block S11 of the method M1, the controller C1 is programmed to control the wafer transportation device 180 to move the wafer table 170 along the predetermined transportation path P1 during the wafer table inspection.

In some embodiments, the controller C1 is a programmable processor or microprocessor. In some embodiments, the transportation path library TPL is a non-transitory computer-readable media. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 8:
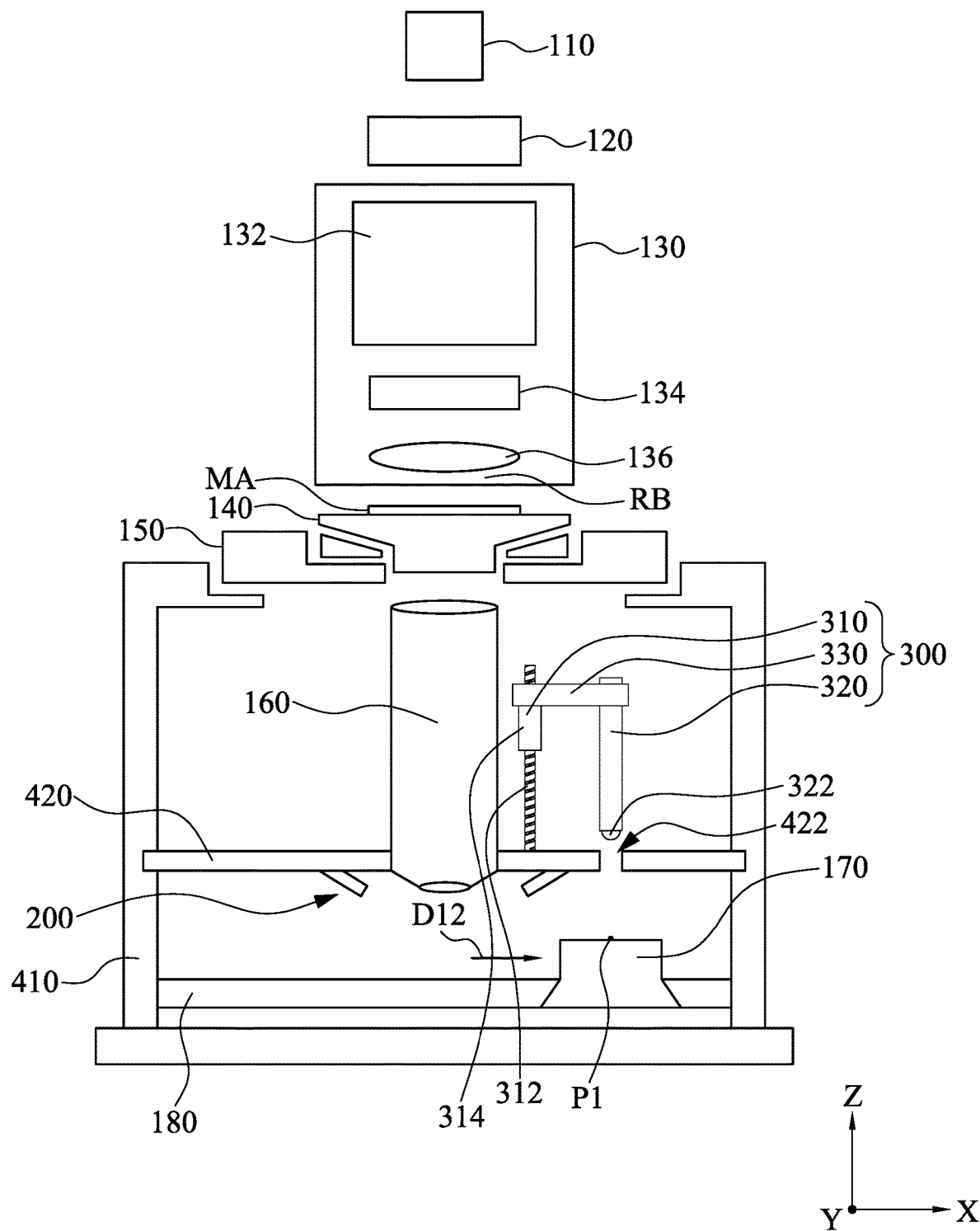

Returning to FIG. 6, the method M1 then proceeds to block S12 where the wafer table is transported to a position under the cleaner. With reference to FIG. 8, in some embodiments, the wafer table 170 is moved in X-direction (indicated by the arrow D12) using the transportation device 180 to the position vertically below the cleaner 320. In some embodiments, moving the wafer table 170 includes actuating the actuators 182 to move along the X-directional guides 184, as illustrated in FIG. 4. In some embodiments, the controller C1 is programmed to control the transportation device 180 to move the wafer table 170 along the predetermined transportation path P2 after completing the wafer table inspection. In other words, the controller C2 triggers transporting the wafer table 170 from the position under the level sensor 200 to the position under the cleaner 320 after completing the wafer table inspection.

Figure 9:
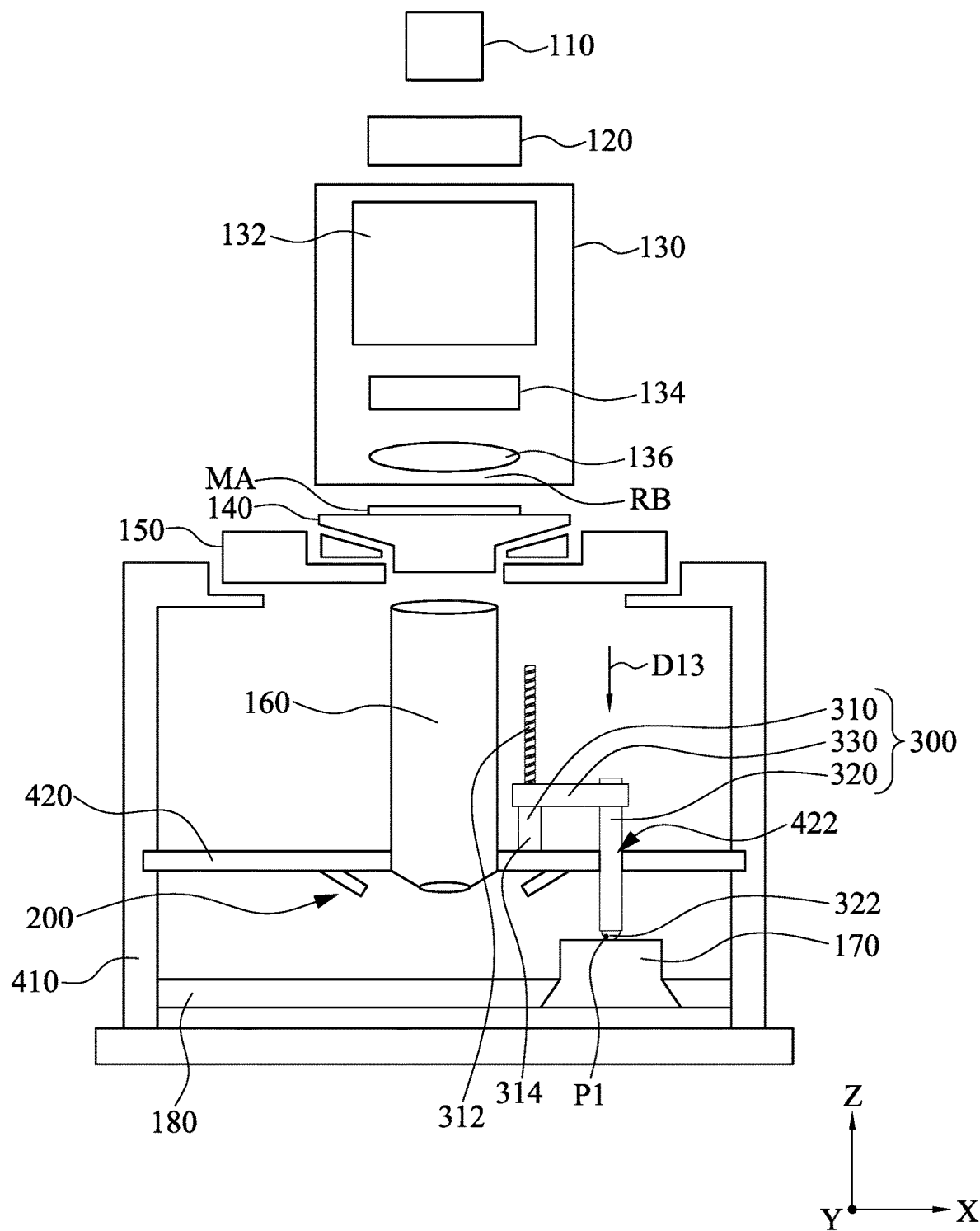

Returning to FIG. 6, the method M1 then proceeds to block S13 where the cleaner is lowered to the wafer table. With reference to FIG. 9, in some embodiments, the cleaner 320 is lowered using the motion actuator 310 (as indicated by the arrow D13). In some embodiments, the motion actuator 310 is controlled by a controller C2, as illustrated in the block diagram of FIG. 11. The controllers C1 and C2 can be programmed in such a way that the controller C2 triggers the actuation of the motion actuator 310 after completing transportation of the wafer table 170 using the transportation device 180 controlled by the controller C1.

Figure 10:
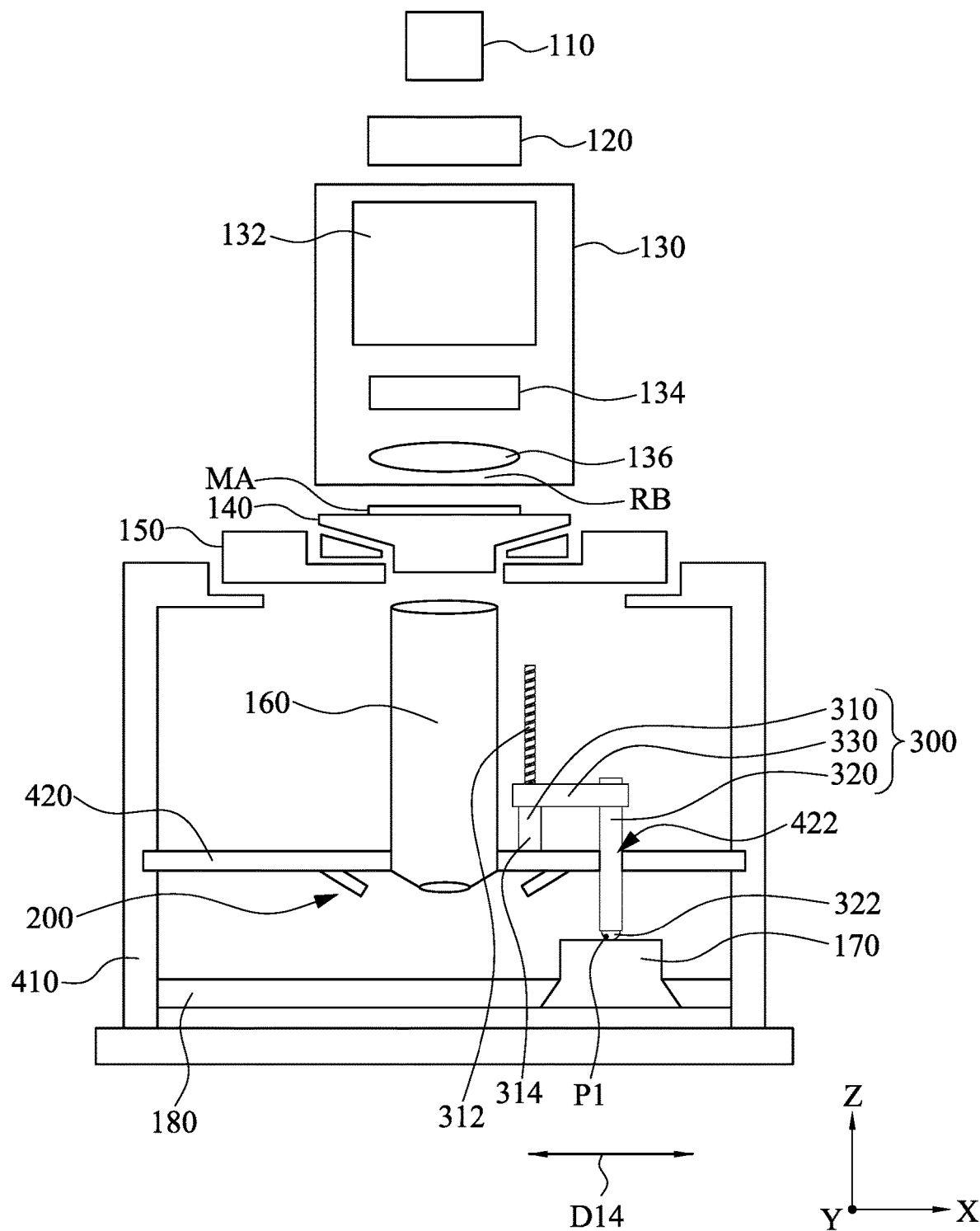

Referring to FIG. 6, the method M1 then proceeds to block S14 where the wafer table is moved when being in contact with the sticky structure. With reference to FIG. 10, in some embodiments, when the sticky structure 322 is in contact with the wafer table 170, the wafer table 170 can be moved either in X-direction (indicated by the double headed arrow D14) or in Y-direction using the transportation device 180. In some embodiments where the sticky structure 322 is a sticky roller ball as discussed previously with respect to FIG. 5, the sticky roller ball 322 in contact with the wafer table 170 will roll due to the movement of the wafer table 170 in X-Y plane. In this way, the particles P1 on the wafer table 170 will be adhered to the sticky roller ball 322 and thus removed from the wafer table 170.

In some embodiments, the controller C1 is in electrical communication with the processing unit 230, so that the controller C1 can receive the particle map PM1 generated from the processing unit 230. In some embodiments, the controller C1 is programmed to control the transportation device 180 to move the wafer table 170 along a path associated with identified particle locations PL1 in the particle map PM1 when the sticky structure 322 is in contact with the wafer table 170.

After removing particles P from the wafer table 170, the method M1 then proceeds to block S15 where the cleaner 320 can be lifted away from the wafer table 170 using the motion actuator 310, resulting in separating the sticky structure 322 from the wafer table 170. Afterwards, in block S16 of the method M1, the wafer table 170 can be moved to a position under the projection system 160 using the transportation device 180. Thereafter, in block S17 of the method M1, a lithography process is performed to the wafer W held by the cleaned wafer table 170, as illustrated in FIG. 1. In some embodiments, the lithography process can be performed using the radiation beam RB1 passing through the photomask MA, as illustrated in FIG. 1.

Figure 12:
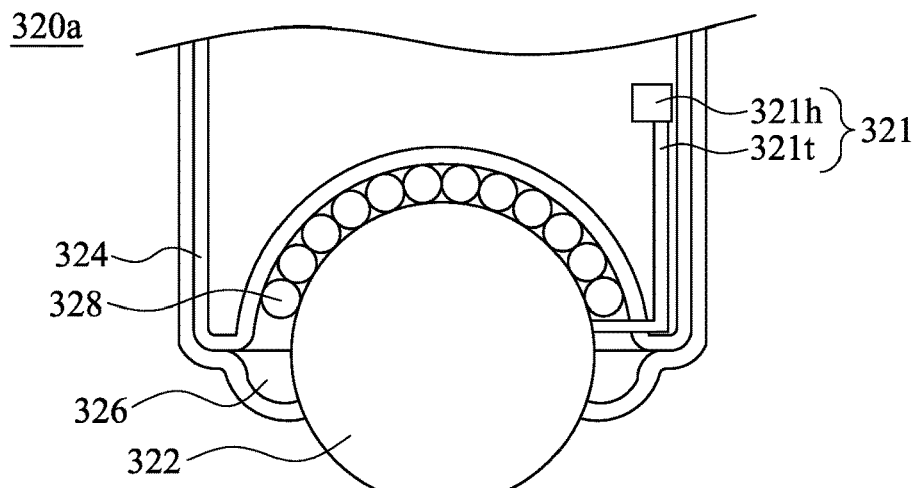
FIG. 12 is a cross-sectional view of a cleaner in accordance with some embodiments of the present disclosure.

FIG. 12 illustrates a cross-sectional view of another cleaner 320a similar to the cleaner 320, except for a heating device 321 having a heater 321h thermally coupled to the sticky structure 322. In greater detail, the heating device 321 a thermally conductive structure 321t having one end in contact with the sticky structure 322 and another end in contact with the heater 321h. In this way, the heating device 321 can heat the sticky structure 322. If the particles are adhered to the wafer table 170, heating the particles may result in reduced adhesion between the particles and the wafer table 170, which in turn will benefit removing particles from the wafer table 170 using the sticky structure 322.

Figure 13:
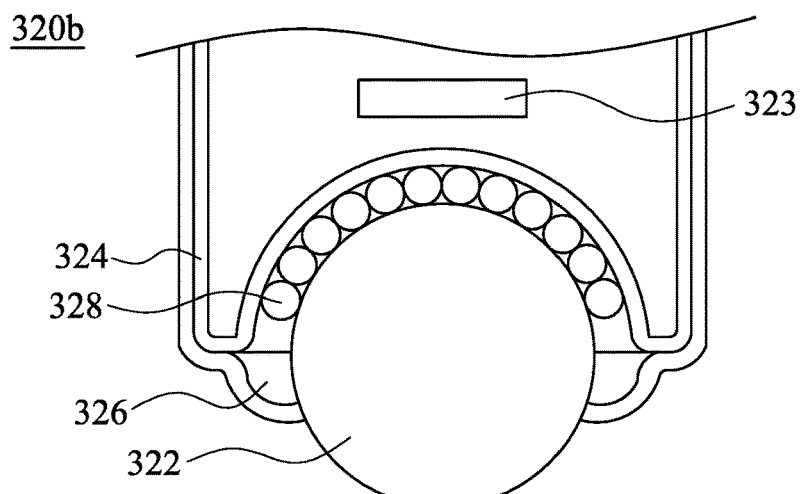
FIG. 13 is a cross-sectional view of a cleaner in accordance with some embodiments of the present disclosure.

FIG. 13 illustrates a cross-sectional view of another cleaner 320b similar to the cleaner 320, except for a vibrator 323 in the housing 324. The vibrator 323 is configured to vibrate the particles on the wafer table 170. In some embodiments, vibration frequency of the vibrator 323 is tuned such that the vibration will induce resonance of particles on the wafer table 170. If the particles are adhered to the wafer table 170, the induced resonance of particles may result in reduced adhesion between the particles and the wafer table 170, which in turn will benefit removing particles from the wafer table 170 using the sticky structure 322.

Figure 14:
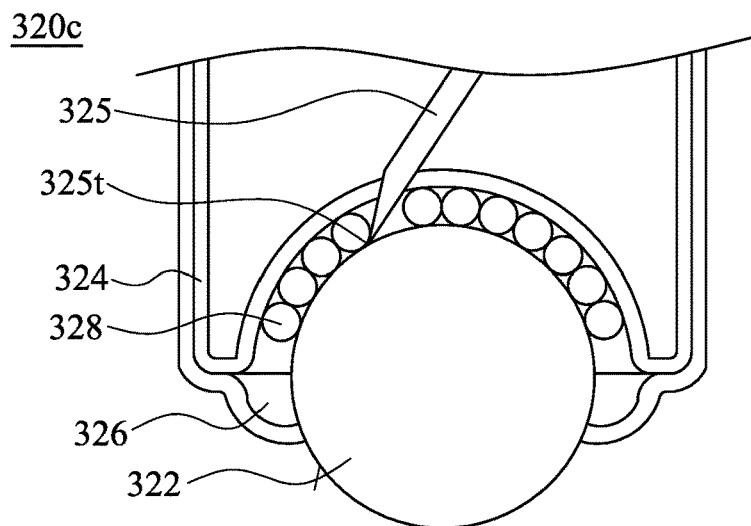
FIG. 14 is a cross-sectional view of a cleaner in accordance with some embodiments of the present disclosure.

FIG. 14 illustrates a cross-sectional view of another cleaner 320c similar to the cleaner 320, except for a cleaning tool 325 in the housing 324 and above the sticky structure 322. In some embodiments, the cleaning tool 325 is a scrapper having a tool tip 325t in contact with the sticky structure 322. As a result, when the sticky structure 322 adhered with particles rolls due to the horizontal movement of the wafer table 170, the tool tip 325t can scratch the particles away from the sticky structure 322, which in turn will clean the sticky structure 322. Stated differently, the cleaning tool 325 can act as a particle blocking structure that blocks the particles on the sticky structure 322 when the particles arrive at the particle blocking structure. In this way, the particles can be detached from the sticky structure 322.

Figure 15:
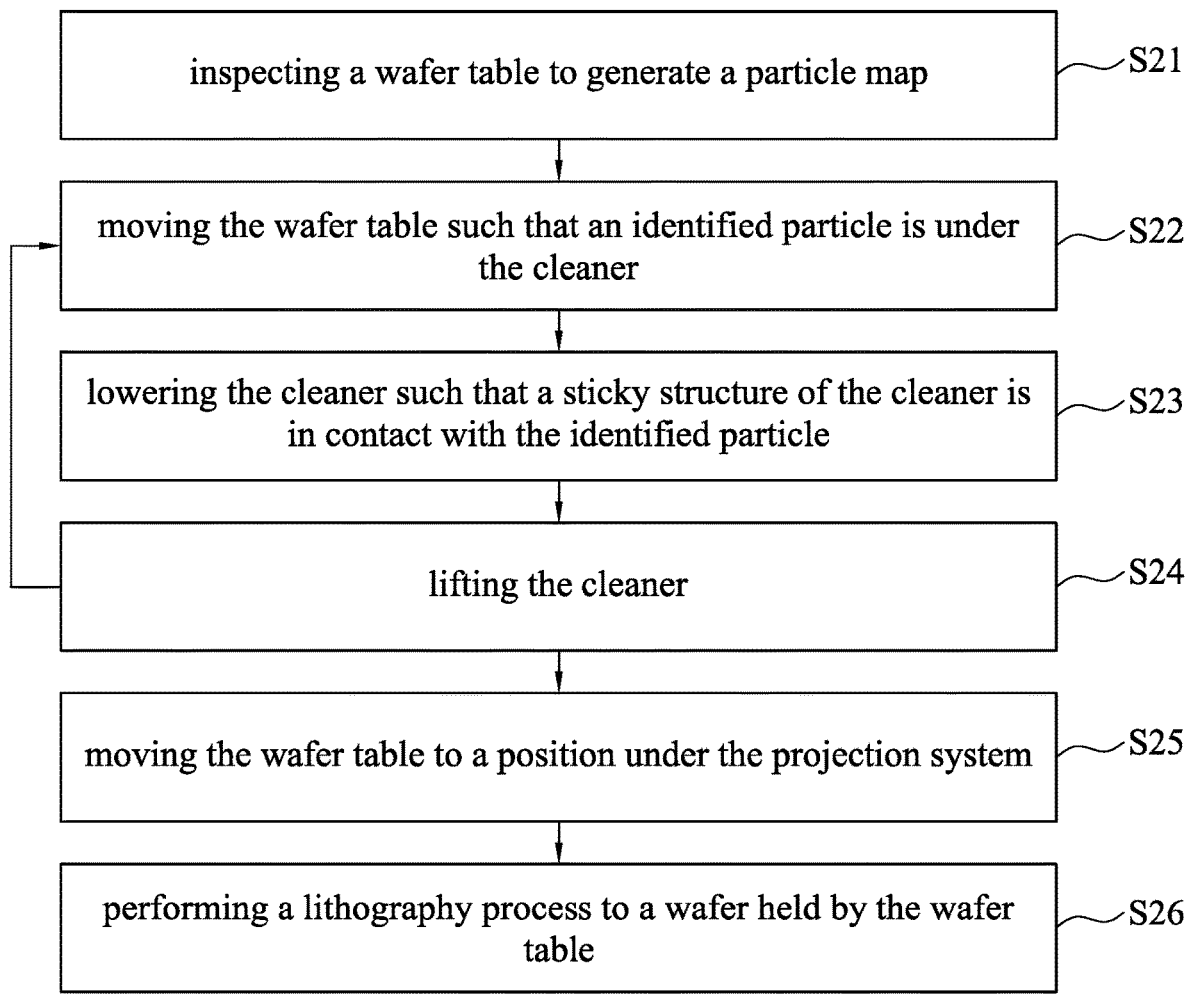
FIG. 15 is a flowchart of a wafer table cleaning method in accordance with some embodiments.

FIG. 15 is a flowchart of a wafer table cleaning method M2 in accordance with some embodiments. FIGS. 16-21 illustrate the wafer table cleaning method M2 at various stages in accordance with some embodiments. The wafer table cleaning method M2 may be implemented in a fab for fabricating a semiconductor device on a wafer using a photomask. It is understood that additional operations may be implemented before, during, and after the method M2, and some of the operations may be replaced, eliminated, or moved around for additional embodiments of the method M2.

Figure 16:
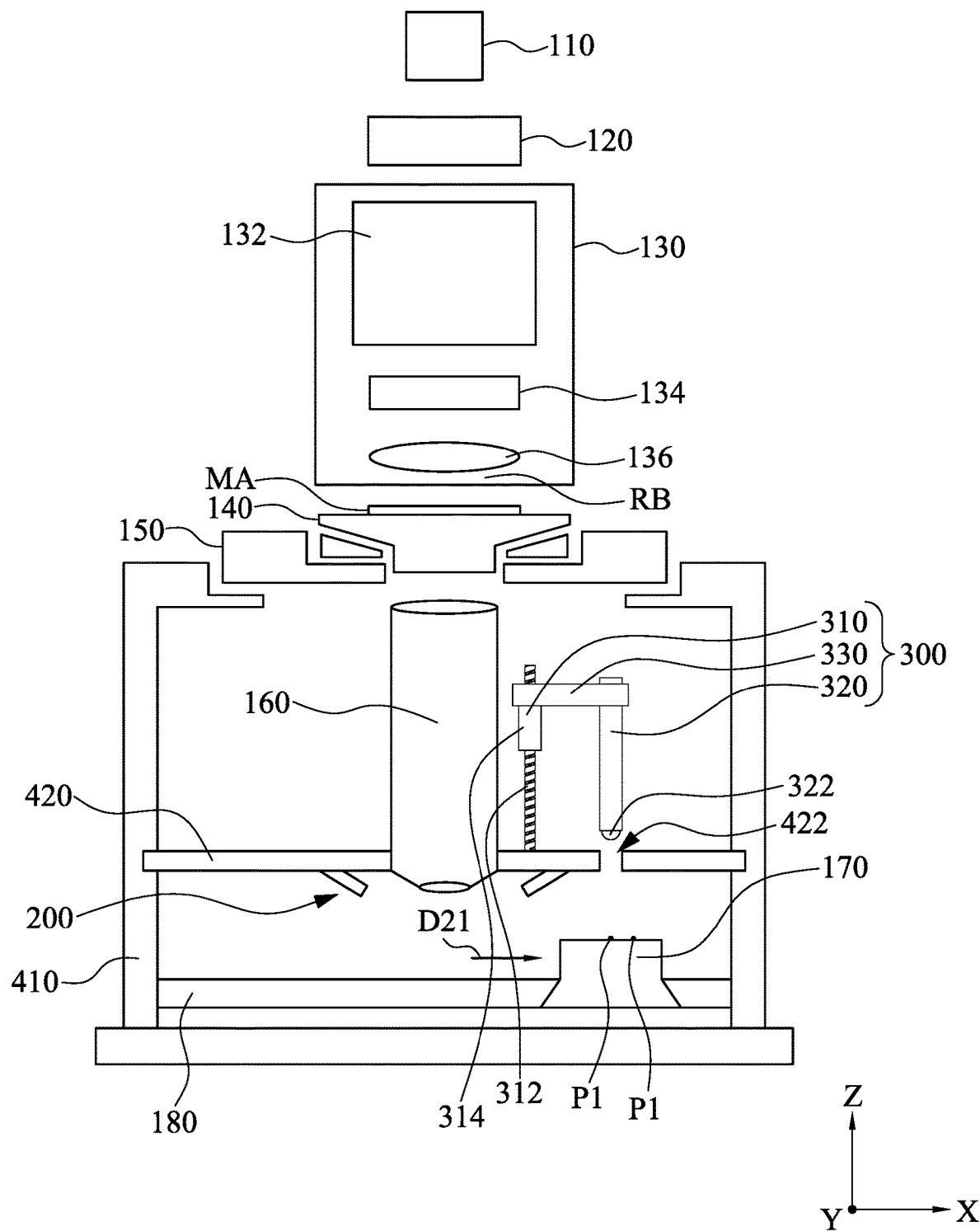
FIGS. 16-21 illustrate the wafer table cleaning method of FIG. 15 at various stages in accordance with some embodiments.

In block S21 of the method M2, the wafer table 170 is inspected to generate a particle map PM1, as discussed previously with respect to block S11 of the method M1. Thereafter, in block S22 of the method M2, the wafer table 170 is moved such that an identified particle P1 on the wafer table 170 associated with an identified particle location PL in the particle map PM1 is moved in X-direction (indicated by the arrow D21) to a position vertically below the cleaner 320, as illustrated in FIG. 16. Movement of the wafer table 170 can be performed using the transportation device 180, as discussed previously with respect to block S12 of the method M1.

Figure 17:
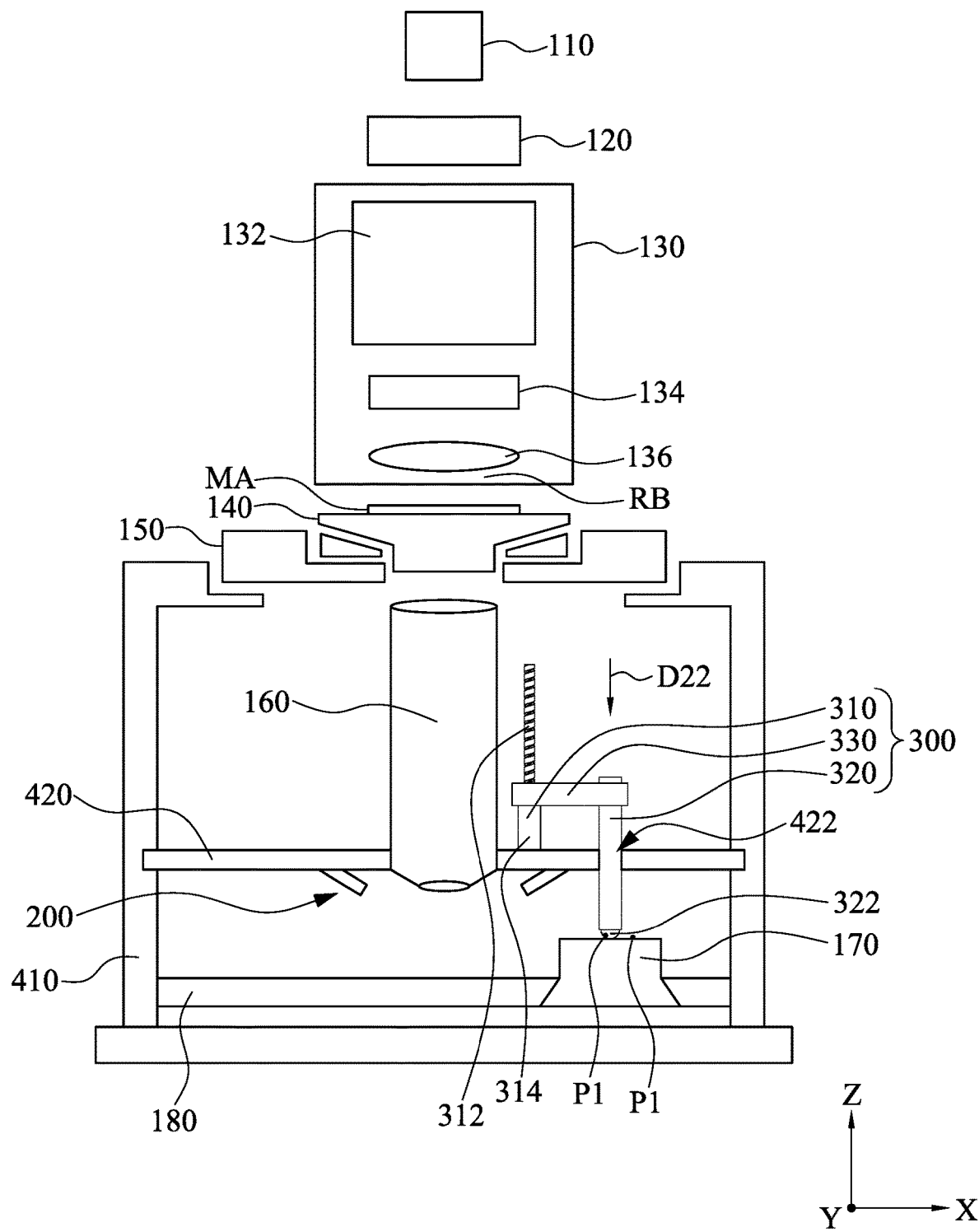
Figure 18:
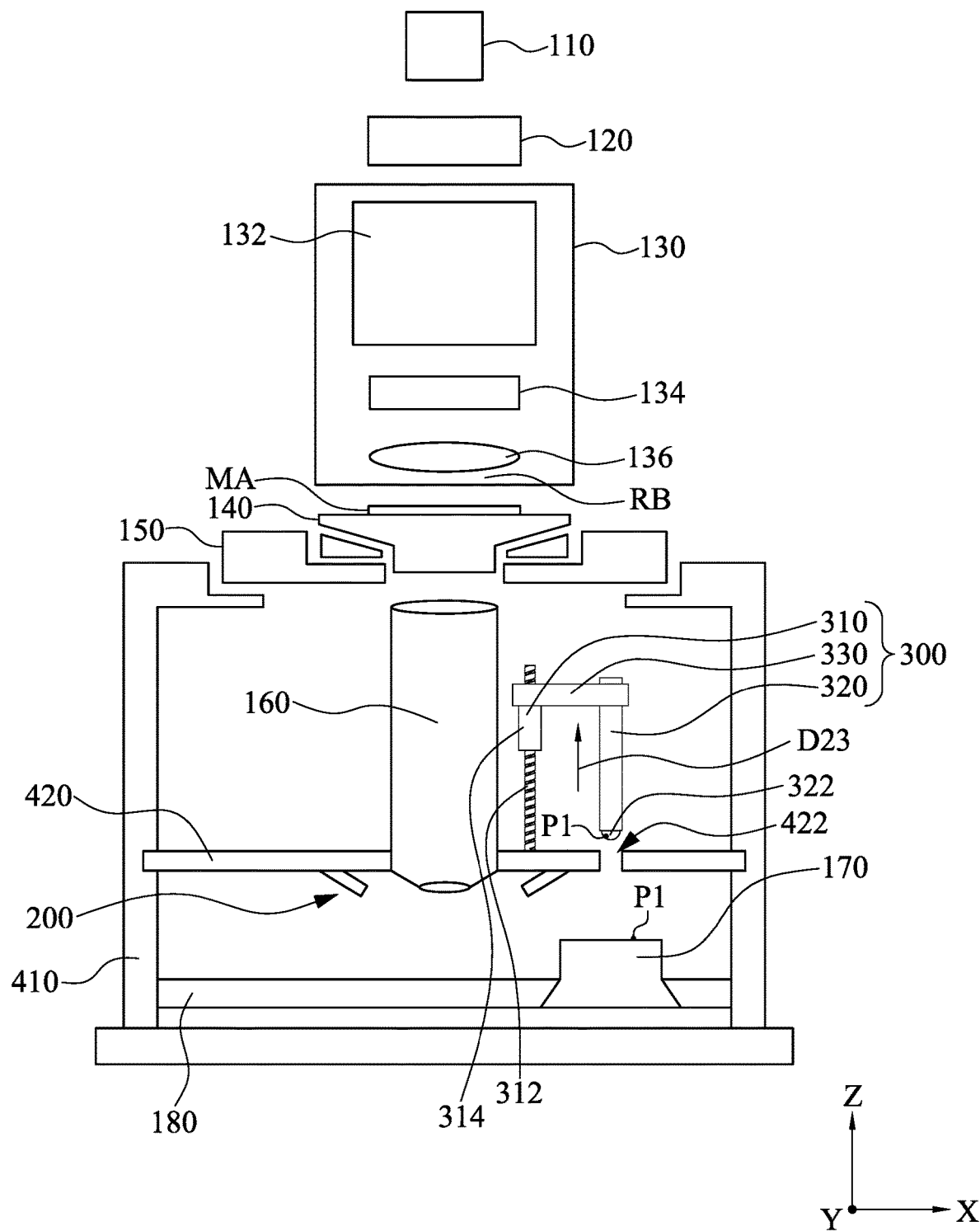

Afterwards, in block S23 of the method M2, the cleaner 320 is lowered until reaching the identified particle P1 on the wafer table 170, as illustrated in FIG. 17 where the cleaner 320 is moved downwards (indicated by the arrow D22). Lowering the cleaner 320 can be performed using the motion actuator 310, as discussed previously with respect to block S13 of the method M1. Thereafter, in block S24 of the method M2, the cleaner 320 is lifted so as to lift the particle P1 away from the wafer table 170, as illustrated in FIG. 18 where the cleaner 320 is move upwards (indicated by the arrow D23).

Figure 19:
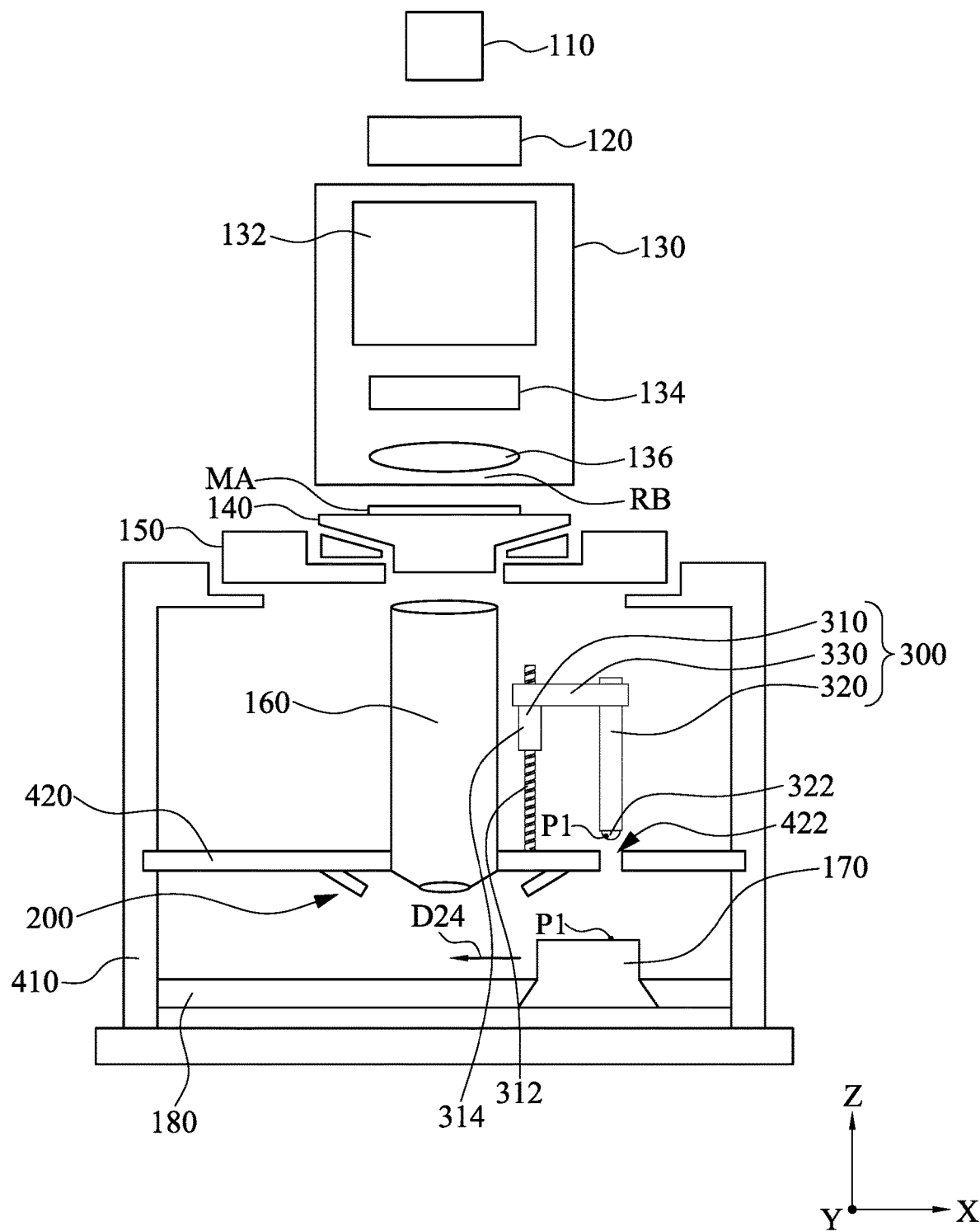
Figure 20:
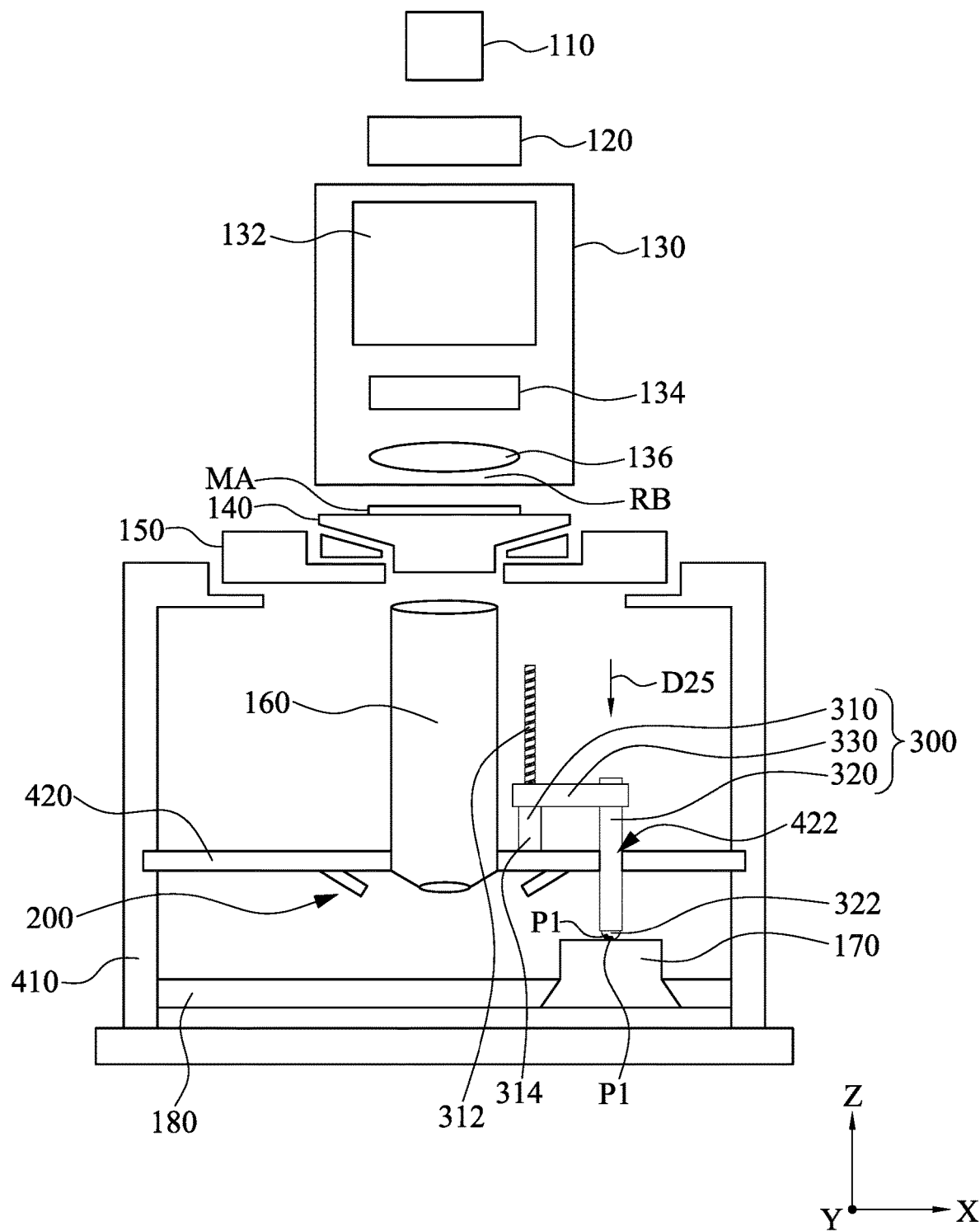
Figure 21:
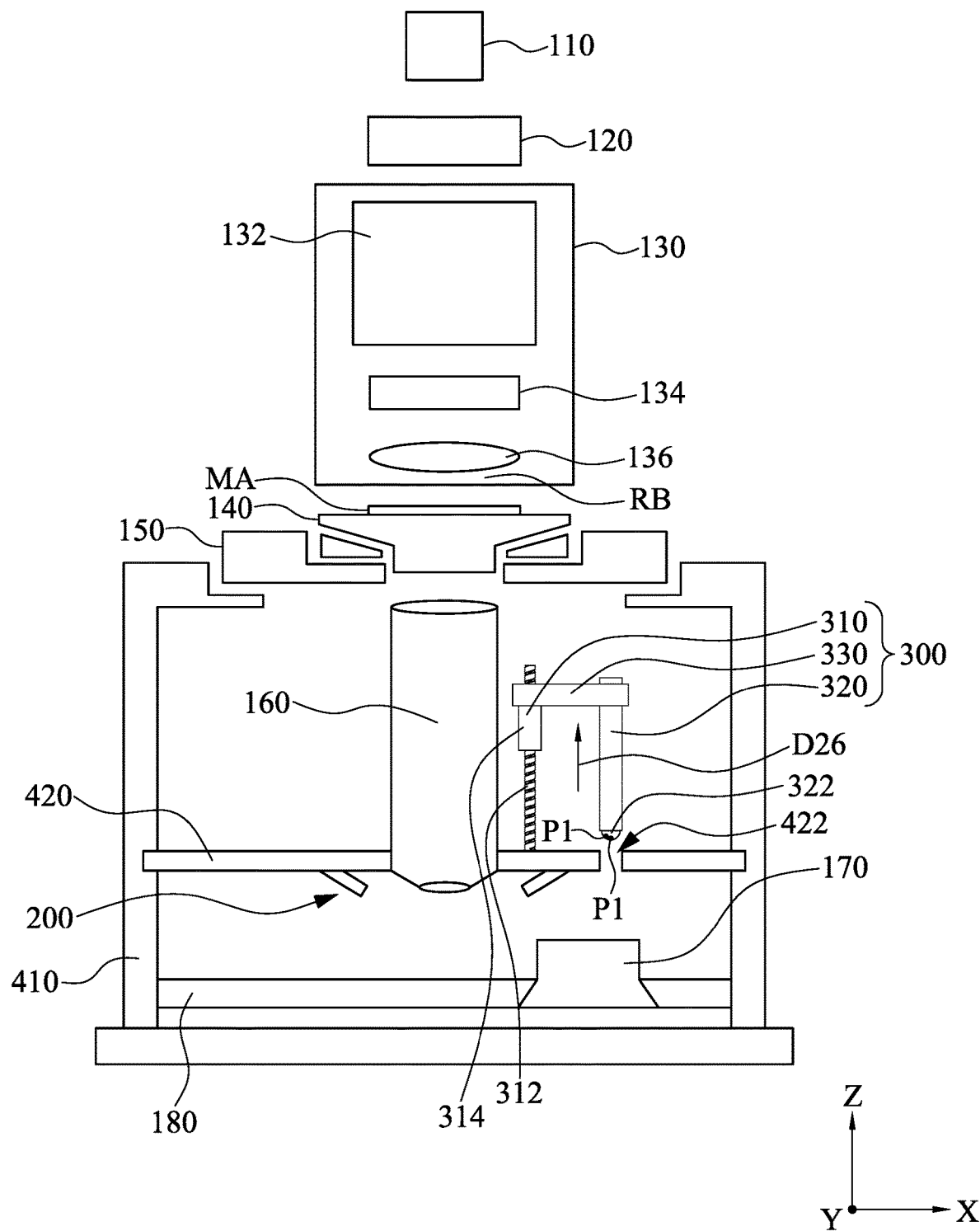

The method M2 then proceeds back to block S22 where the wafer table 170 is moved in X-direction (indicated by the arrow D24 in FIG. 19) and/or in Y-direction such that another identified particle P1 on the wafer table 170, associated with another identified particle location PL in the particle map PM1, is moved to the position vertically below the cleaner 320, as illustrated in FIG. 19. Afterwards, the method M2 proceeds to blocks S23 where the cleaner 320 is lowered until reaching the another identified particle P1 on the wafer table 170, as illustrated in FIG. 20 where the cleaner 320 is moved downwards (indicated by the arrow D25). Thereafter, in block S24 of the method M2, the cleaner 320 is lifted so as to lift the another particle P1 away from the wafer table 170, as illustrated in FIG. 21 where the cleaner 320 is moved upwards (indicated by the arrow D26).

Blocks S22, S23 and S24 of the method M2 are in combination serve as a cyclic operation. After one or more repetitions of the cyclic operation to remove all identified particles from the wafer table 170, the method M2 proceeds to block S25 where the wafer table 170 can be moved to a position under the projection system 160 using the transportation device 180. Thereafter, in block S26 of the method M2, a lithography process is performed to the wafer W (See FIG. 1) held by the cleaned wafer table 170.

In some embodiments of method M2, the wafer table 170 remains stationary during the period that the sticky structure 322 is in contact with the wafer table 170. As a result, the sticky structure 322 might not roll because of lack of horizontal movement of the wafer table 170. Embodiments of the present disclosure thus provide another cleaner 320d that is capable of actively rolling the sticky structure 322 thereof, as illustrated in FIG. 22.

Figure 22:
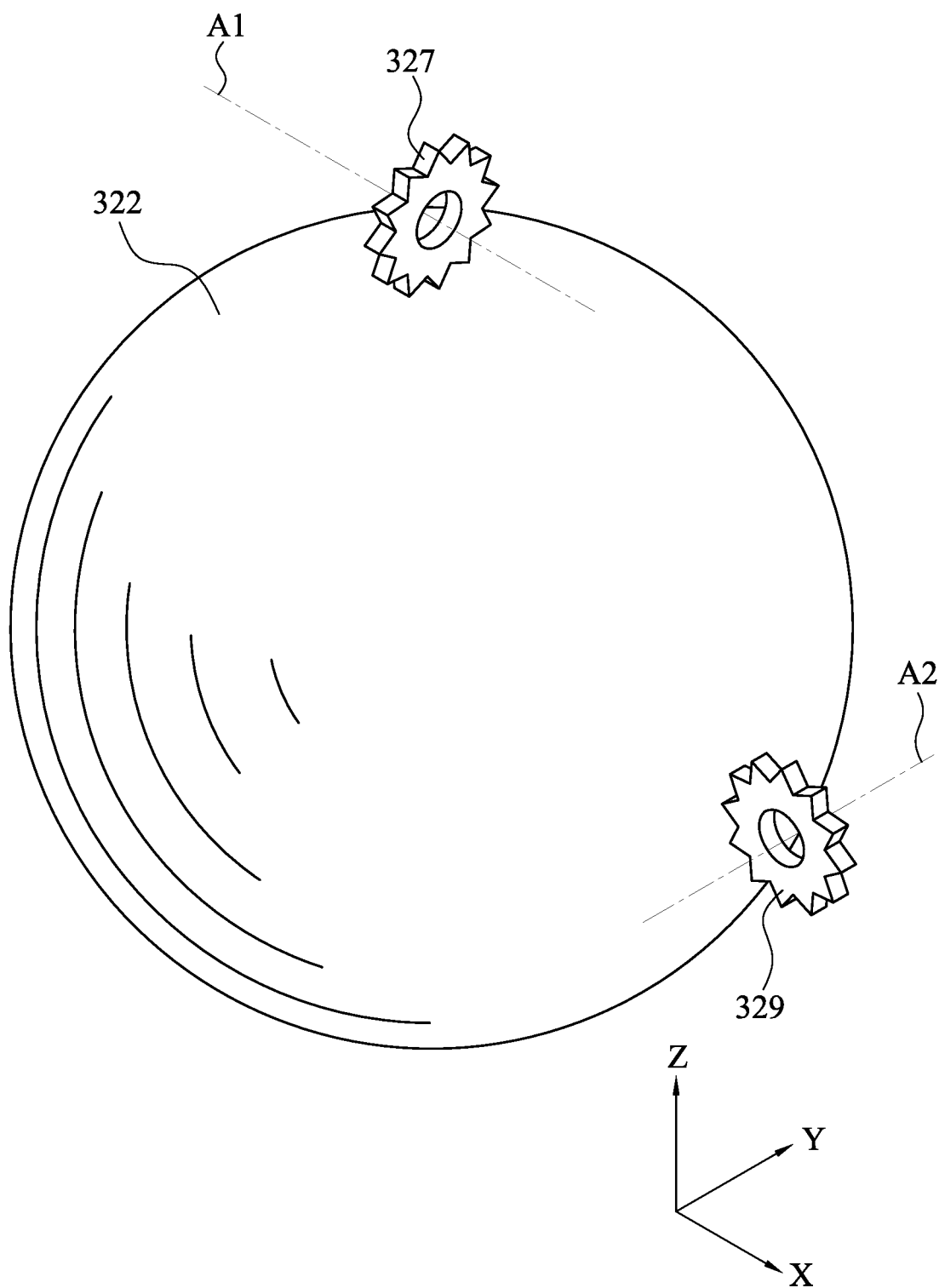
FIG. 22 illustrates a cleaner in accordance with some embodiments of the present disclosure.

As illustrated in FIG. 22, the cleaner 320d includes the sticky structure 322, a first rotation actuator 327 and a second rotation actuator 329. The first and second actuators 327 and 329 are in contact with different portions of the sticky structure 322. The first rotation actuator 327 is rotatable about an X-directional axis A1, and the second rotation actuator 329 is rotatable about a Y-directional Axis A2. In this way, the first and second rotation actuators 327 and 329 can rotate the sticky structure 322 multi-directionally. In some embodiments, the first and second rotation actuators 327 and 329 each include a stepper motor fabricated using micro-electro-mechanical system (MEMS) techniques and controlled using an optical encoder.

In some embodiments of method M2, after the cleaner 320d adhered with a particle P1 is lifted from the wafer table 170 (block S24), the first rotation actuator 327 and/or the second rotation actuator 329 rotate the sticky structure 322, so that the particle P1 adhered to the sticky structure 322 can be rotated upwardly. As a result, when the cleaner 320d is lowered again to another particle P1, it will be adhered to a clean area on the sticky structure 322 that is free from the pre-adhered particle P1.

Embodiments as described above relate to removing particles from the wafer table using the sticky structure. However, this concept can also be used in other applications. For example, following embodiments relate to removing particles from the photomask using the sticky structure.

Figure 23:
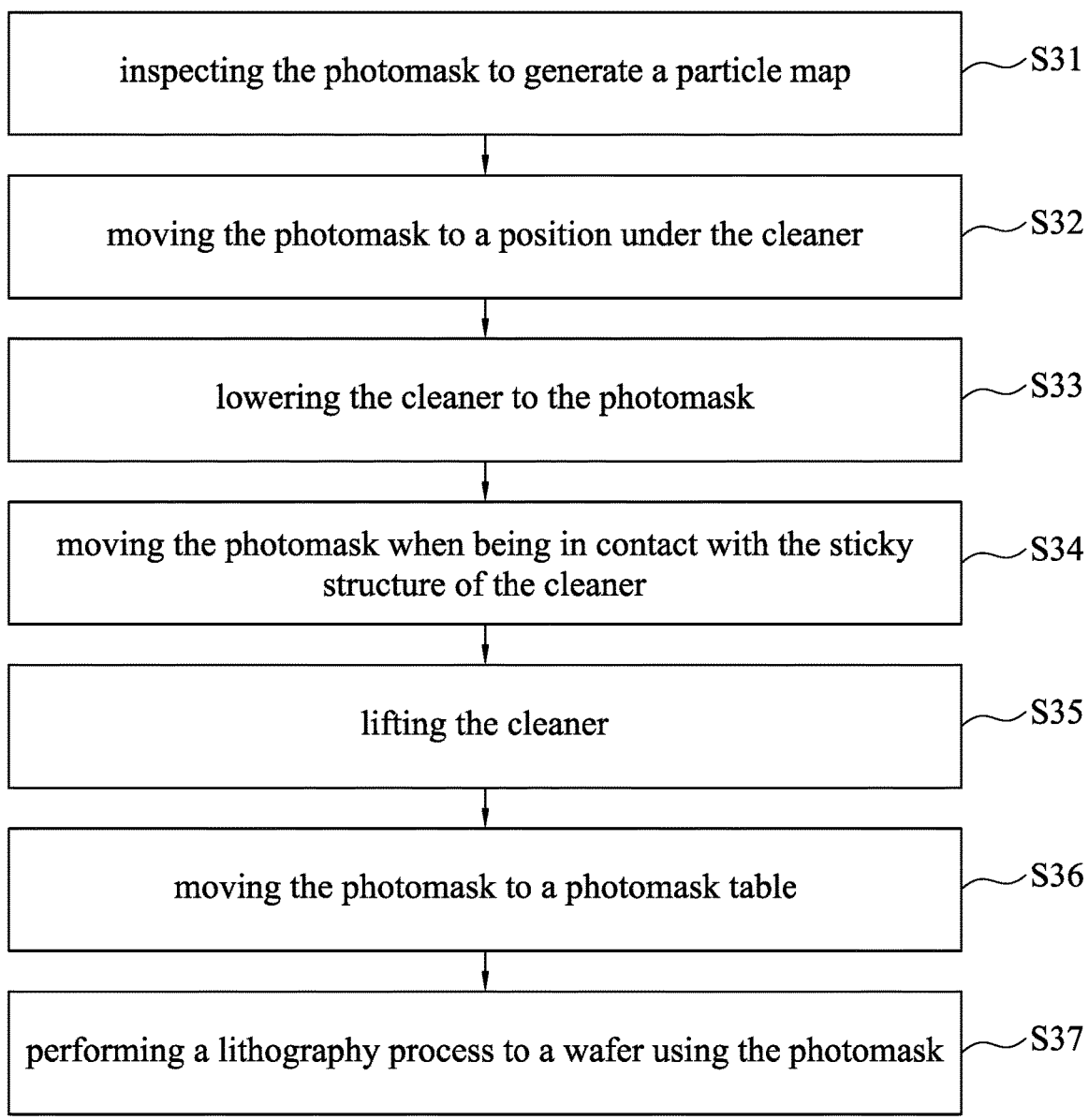
FIG. 23 is a flowchart of a photomask cleaning method in accordance with some embodiments.

FIG. 23 is a flowchart of a photomask cleaning method M3 in accordance with some embodiments. FIGS. 24-28 illustrate the photomask cleaning method M3 at various stages in accordance with some embodiments. The photomask cleaning method M3 may be implemented in a fab for fabricating a semiconductor device on a wafer using a photomask. It is understood that additional operations may be implemented before, during, and after the method M3, and some of the operations may be replaced, eliminated, or moved around for additional embodiments of the method M3.

The method M3 begins at block S31 where the photomask is inspected to generate a particle map. Photomask can be inspected for particles using, for example, scattered light techniques. With a scattered light technique, a laser beam is focused on a photomask and a radiation beam that is scattered away from a specular reflection direction is detected. Particles on the photomask surface will randomly scatter the light. By observing the illuminated surface with a microscope, the particles will light up as bright spots. In this way, the particle locations on the photomask can be identified, which in turn will facilitate the particle removing process using the sticky structure as discussed previously.

In some embodiments, a scatterometer operating with visible or ultraviolet (UV) light allows faster photomask inspection than scanning imaging systems (e.g., confocal, EUV or electron beam microscope systems). Scatterometer uses a laser radiation beam and a coherent optical system with a Fourier filter in the pupil plane that blocks light diffracted from a pattern on the reticle. This type of scatterometer detects light scattered by defects over the level of background coming from a periodic pattern on the reticle.

Figure 24:
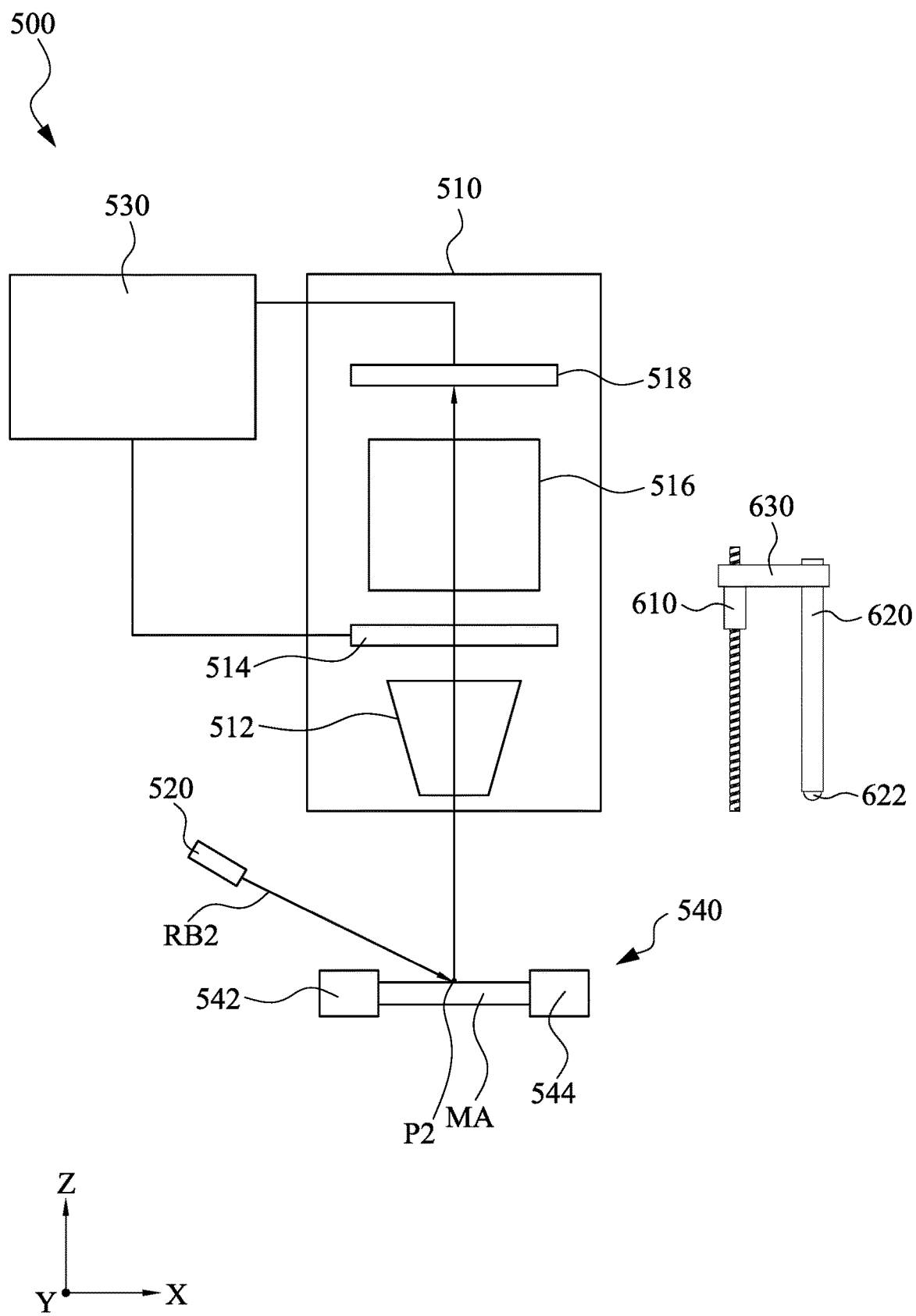
FIGS. 24-28 illustrate the photomask cleaning method of FIG. 23 at various stages in accordance with some embodiments.
Figure 25:
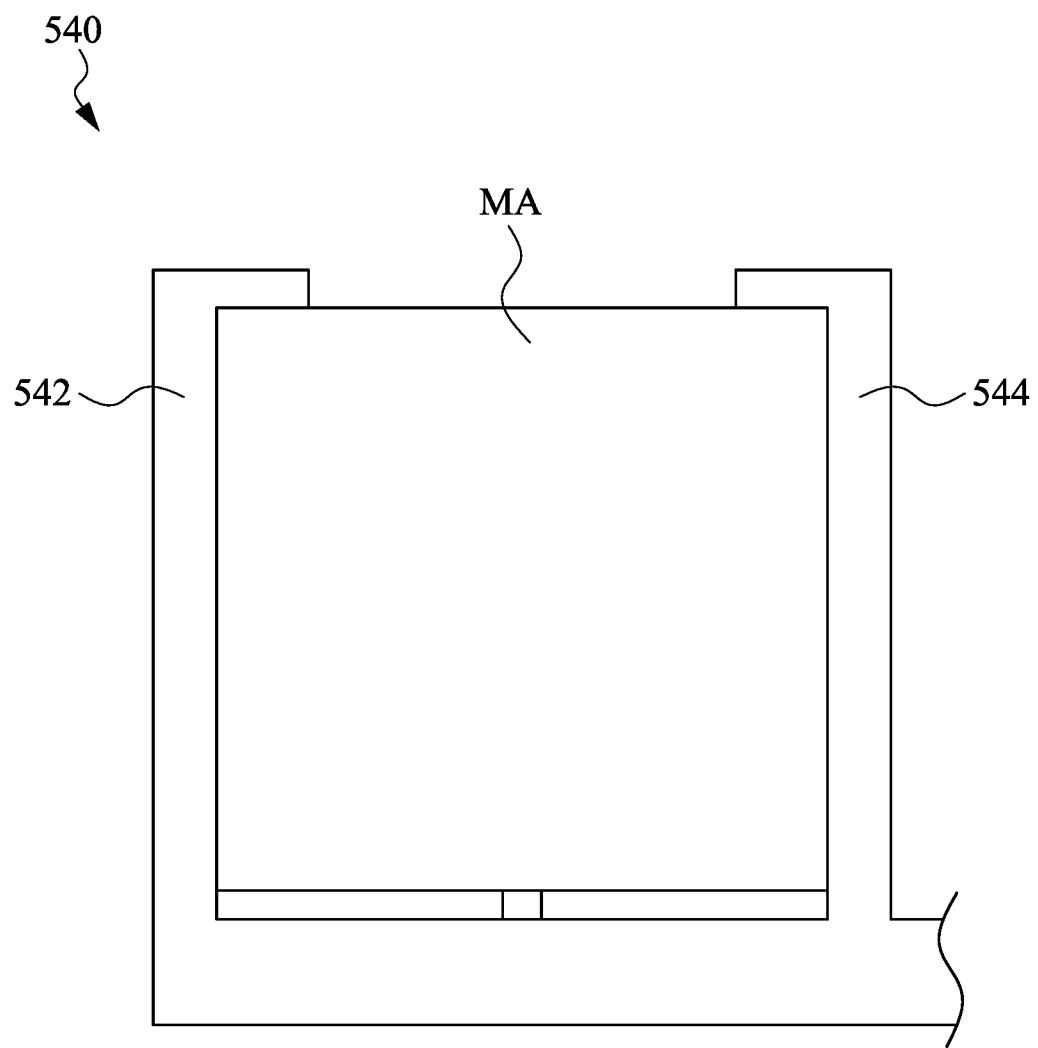

One exemplary photomask inspection system is shown in FIG. 24. The exemplary photomask inspection system 500 includes a channel 510 including a microscope objective 512, a pupil filter 514, a projection optical system (e.g., projection lens) 516, and a detector 518. A radiation (e.g., laser) beam RB2 generated from a light source 520 illuminates a photomask MA gripped by gripper arms 542 and 544 of a reticle gripper 540, wherein FIG. 25 illustrates a top view of the reticle gripper 540. In some embodiments, the reticle gripper 540 can be referred to as a holding device because it can hold the photomask MA. Pupil filter 514 is used to block optical scattering due to the pattern of the photomask MA. A processing unit 530 can be used to control the filtering of pupil filter 514 based on the pattern of the photomask MA. Accordingly, filter 514 is provided as a spatial filter in a pupil plane relative to the photomask MA and is associated with the pattern of the photomask MA so as to filter out radiation from the scattered radiation. Detector 518 detects a fraction of radiation that is transmitted by projection optical system 516 for detection of particles P2. The processing unit 530 thus generates a particle map PM2 based on detection result generated from the detector 518, as exemplarily illustrated in FIG. 29. In some embodiments, the processing unit 530 is a central processing unit (CPU) in a computer or the like.

Figure 26:
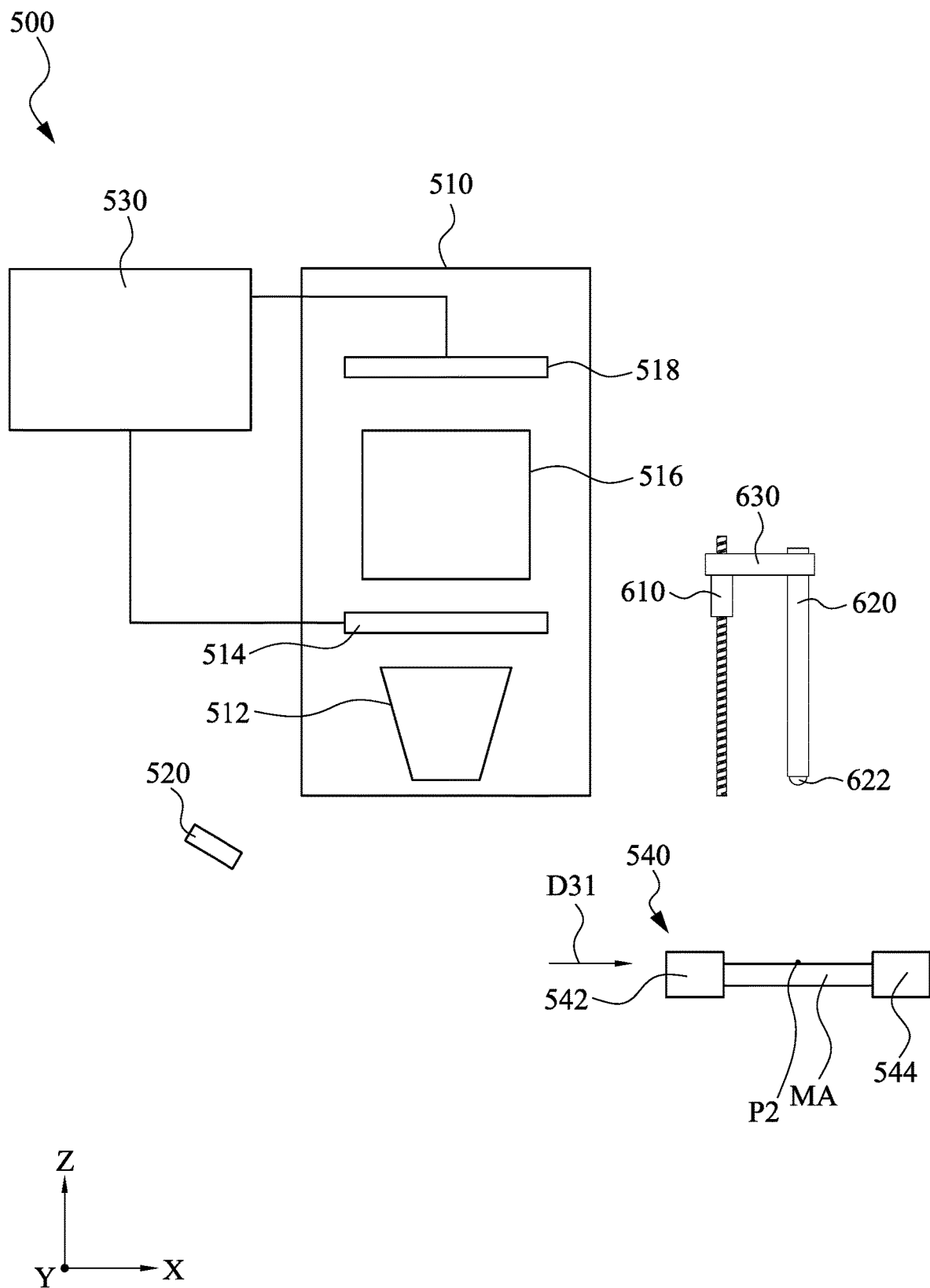

Returning to FIG. 23, the method M3 then proceeds to block S32 where the photomask is transported to a position under the cleaner. With reference to FIG. 26, in some embodiments, the photomask MA is moved in X-direction (indicated by the arrow D31) using the reticle gripper 540 to the position vertically below the cleaner 620. In some embodiments, the reticle gripper 540 is controlled by a controller C3, as illustrated in the block diagram of FIG. 29. The controller C3 is programmed to control the reticle gripper 540 to move the photomask MA to the position under the cleaner 620 after completing the photomask inspection. In some embodiments, the controller C3 is a programmable processor, microprocessor or the like.

Returning to FIG. 23, the method M3 then proceeds to block S33 where the cleaner is lowered to the photomask.

Figure 27:
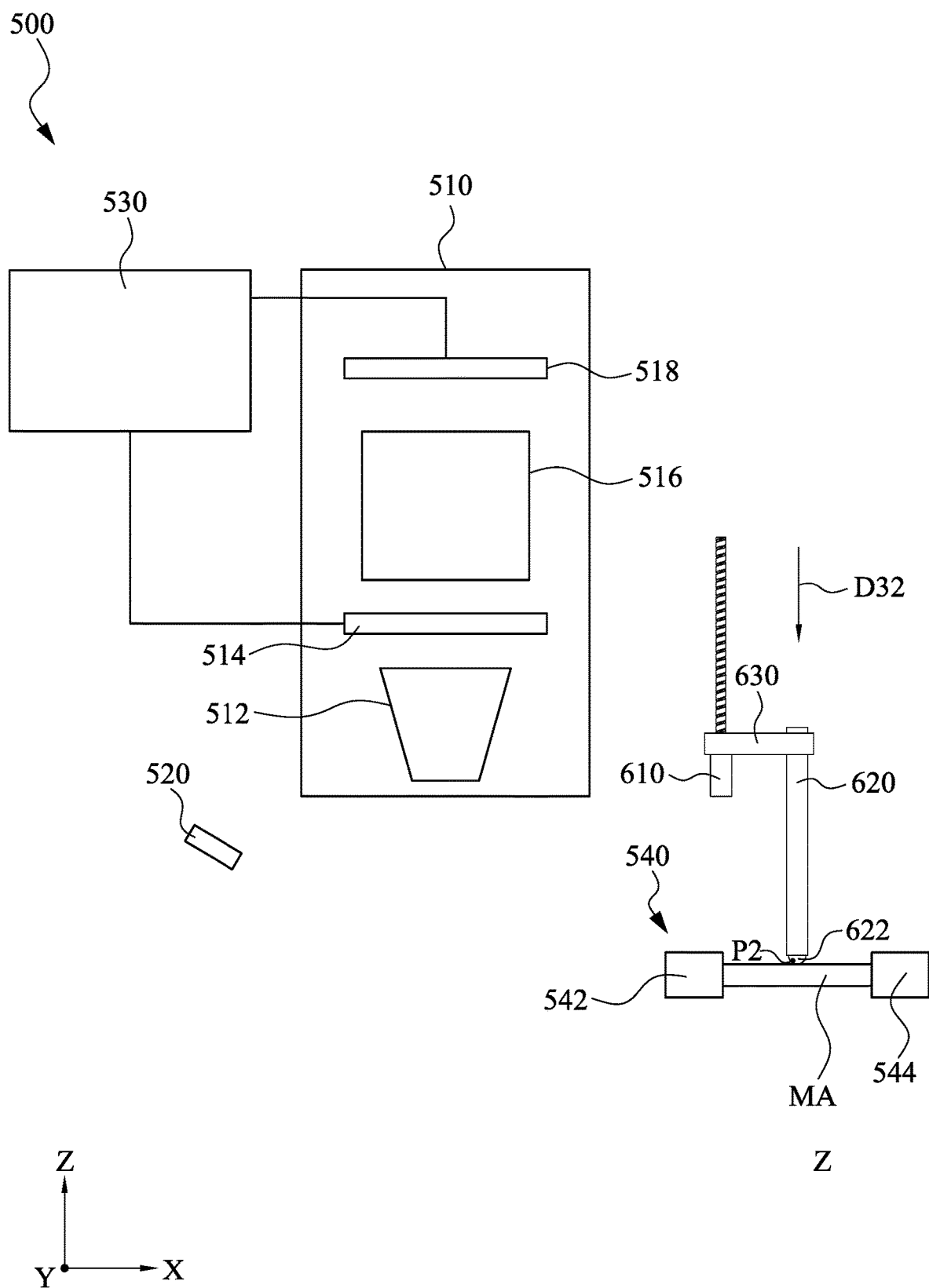

With reference to FIG. 27, in some embodiments, the cleaner 620 fixed to the motion actuator 610 via the cantilever 630 is lowered (indicated by the arrow D32) using the motion actuator 610, as discussed previously with respect to the particle removal device 300. In some embodiments, the motion actuator 610 is controlled by a controller C4, as illustrated in the block diagram of FIG. 29. The controllers C3 and C4 can be programmed in such a way that the controller C4 triggers the actuation of the motion actuator 610 after completing transportation of the photomask MA using the reticle gripper 540 controlled by the controller C3.

Figure 28:
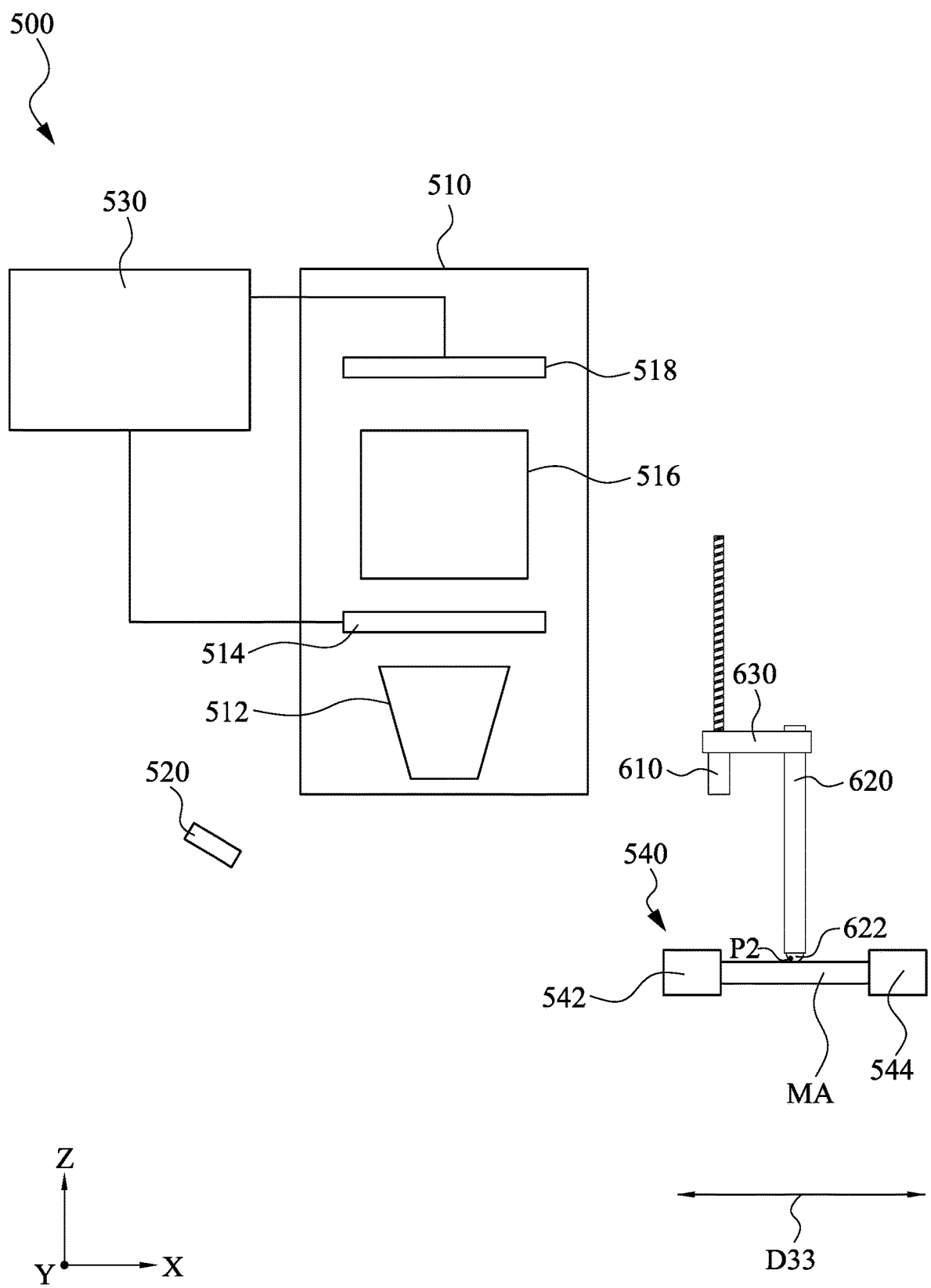

Referring to FIG. 23, the method M3 then proceeds to block S34 where the photomask is moved during when being in contact with the sticky structure. With reference to FIG. 28, in some embodiments, when the sticky structure 622 of the cleaner 620 is in contact with the photomask MA, the photomask MA can be moved either in X-direction (indicated by the double headed arrow D33) or in Y-direction using the reticle gripper 540. In some embodiments where the sticky structure 622 is a sticky roller ball as discussed previously with respect to the sticky structure 322, the sticky roller ball 622 in contact with the photomask MA will roll due to the movement of the photomask MA in X-Y plane. In this way, the particles on the photomask MA will be adhered to the sticky roller ball 622 and thus removed from the photomask MA.

In some embodiments, the controller C3 is in electrical communication with the processing unit 530, so that the controller C3 can receive the particle map PM2 generated from the processing unit 530. In some embodiments, the controller C3 is programmed to control the reticle gripper 540 to move the photomask MA along a path associated with identified particle locations PL2 in the particle map PM2 when the sticky structure 622 is in contact with the photomask MA.

After removing particles from the photomask MA, the method M3 proceeds to block S35 where the cleaner 620 is lifted using the motion actuator 610. Afterwards, in block S36 of the method M3, the photomask MA can be moved to the photomask table in a lithographic apparatus (e.g., the photomask table 150 in the lithographic apparatus as shown in FIG. 1). Thereafter, the method proceeds to block S37 where a lithography process is performed to a wafer (e.g., the wafer W as shown in FIG. 1) using the cleaned photomask MA. For example, the lithography process can be performed using the radiation beam RB1 passing through the cleaned photomask MA, as illustrated in FIG. 1.

In the depicted embodiments in FIGS. 24-28, the method M3 uses the cleaner 620 to remove particles from the photomask MA. In some other embodiments, the cleaner 620 used in the method M3 can be replaced with the cleaner 320a as shown in FIG. 12, the cleaner 320b as shown in FIG. 13, and/or the cleaner 320c as shown in FIG. 14. Stated differently, a heating device (e.g., the heating device 321 as shown in FIG. 12) and/or a vibrator (e.g., the vibrator 323 as shown in FIG. 13) can be integrated into the cleaner 620 to heat and/or vibrate the particles when the particles is on the photomask MA, which in turn will improve particle removal performance. In some embodiments, the cleaning tool 325 can also be integrated into the cleaner 620. As a result, when the sticky structure 622 rolls due to horizontal movement of the photomask MA, particles adhered to the sticky structure 622 can be detached from the sticky structure 622 by the tool tip 325t of the cleaning tool 325.

Figure 30:
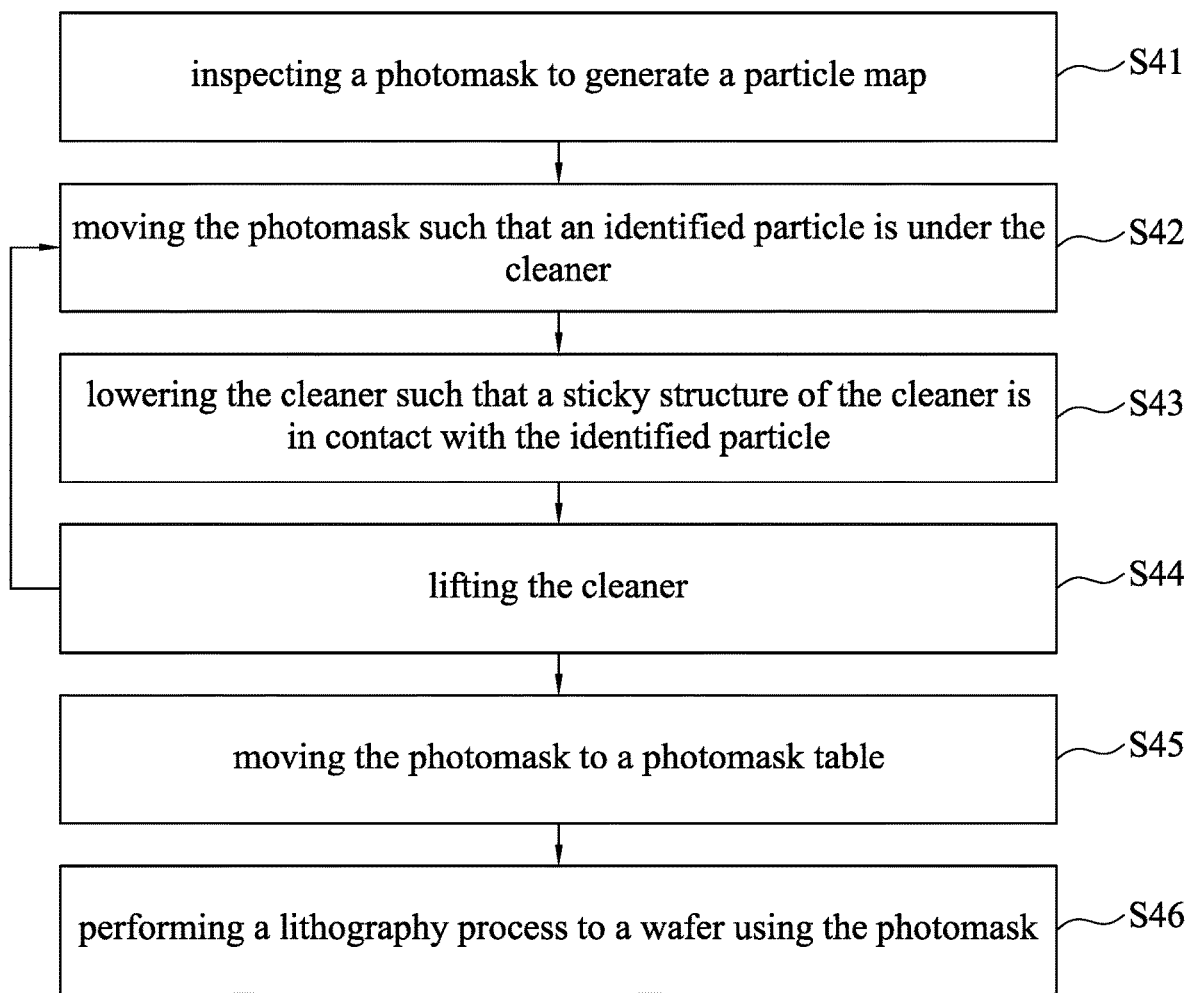
FIG. 30 is a flowchart of a photomask cleaning method in accordance with some embodiments.

FIG. 30 is a flowchart of a photomask cleaning method M4 in accordance with some embodiments. FIGS. 31-36 illustrate the photomask cleaning method M4 at various stages in accordance with some embodiments. The photomask cleaning method M4 may be implemented in a fab for fabricating a semiconductor device on a wafer using a photomask. It is understood that additional operations may be implemented before, during, and after the method M4, and some of the operations may be replaced, eliminated, or moved around for additional embodiments of the method M4.

Figure 29:
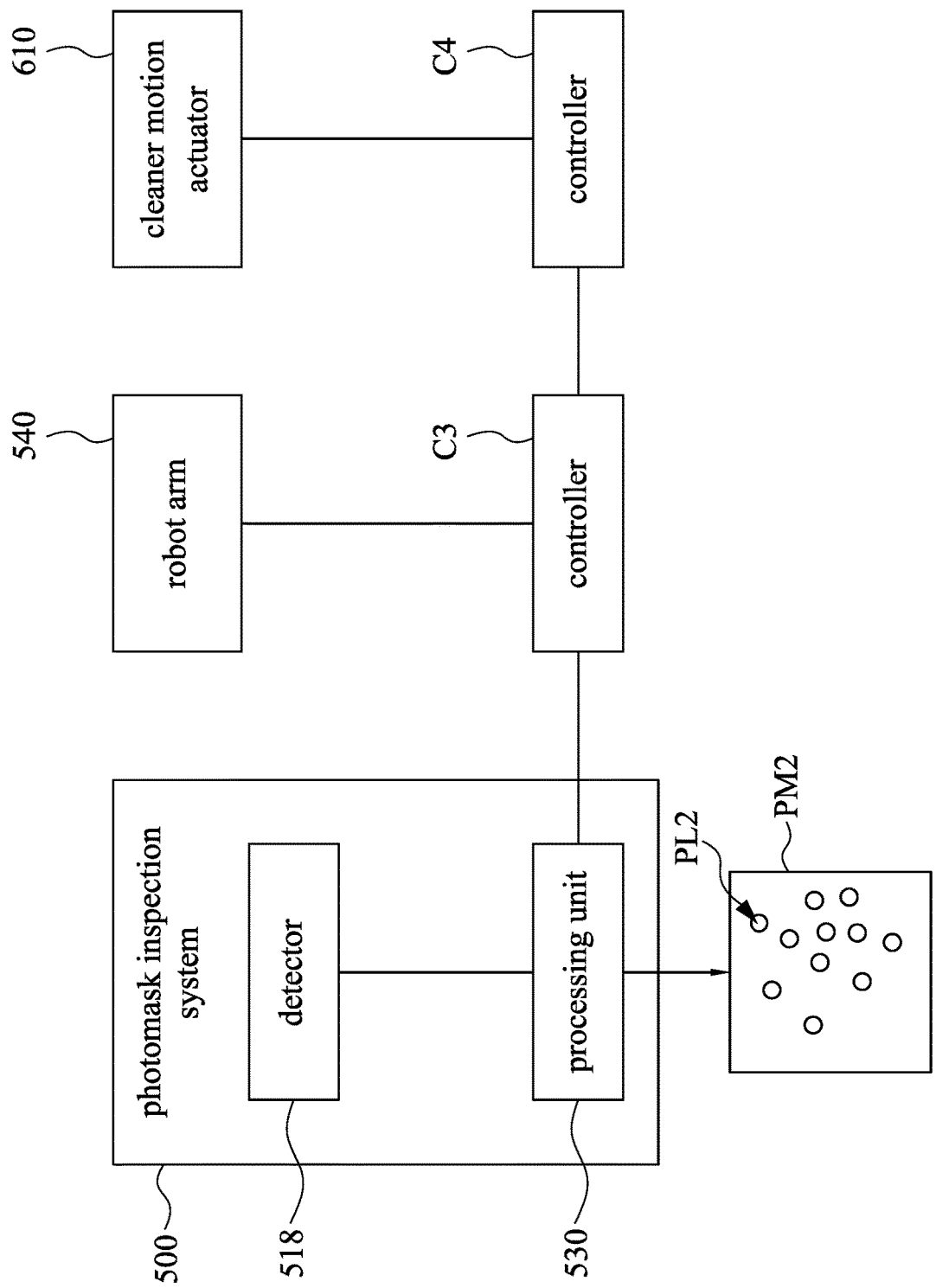
FIG. 29 is a block diagram associated with a photomask cleaning method in accordance with some embodiments.
Figure 31:
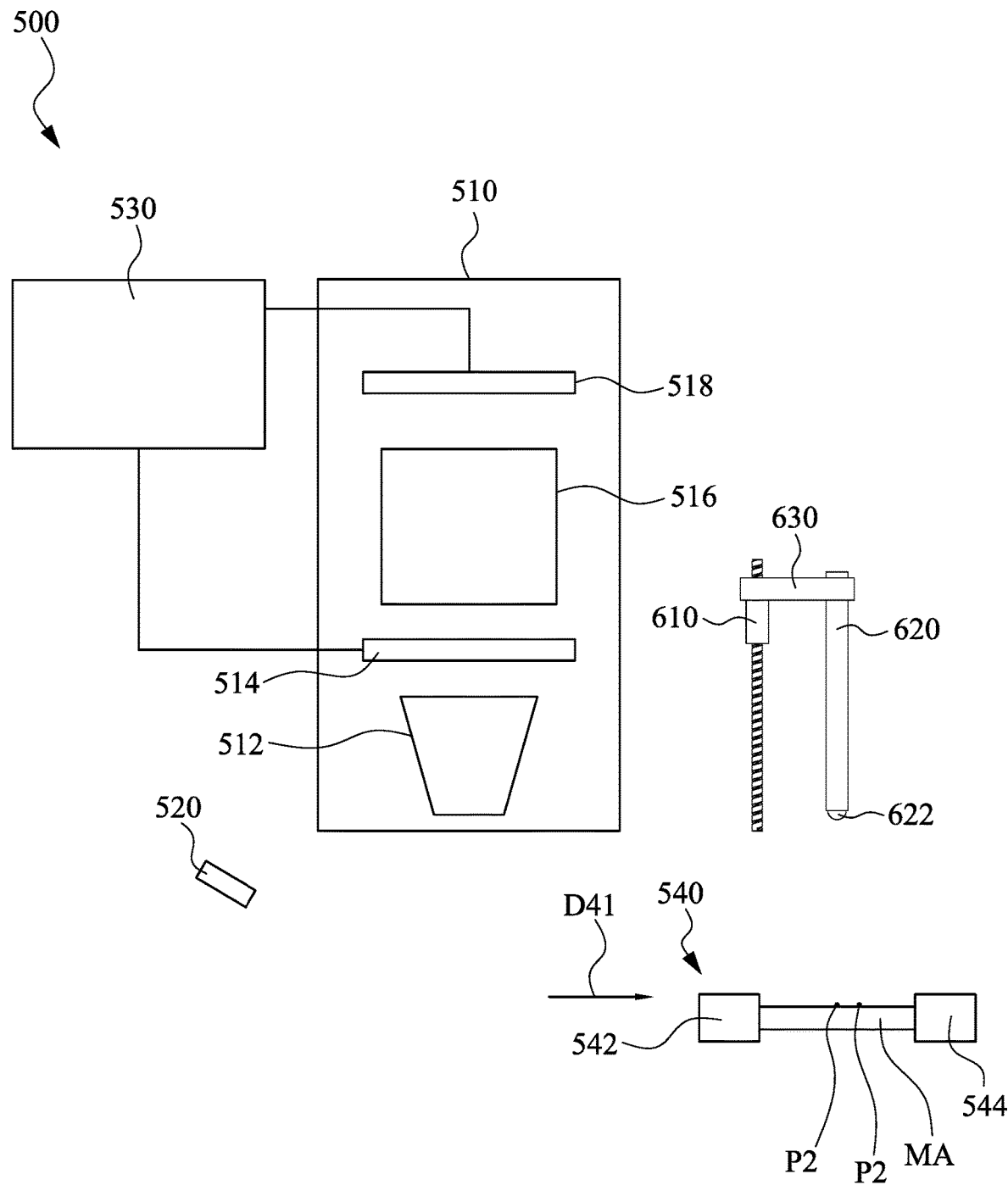
FIGS. 31-36 illustrate the photomask cleaning method of FIG. 30 at various stages in accordance with some embodiments.

In block S41 of the method M4, the photomask MA is inspected to generate a particle map PM2, as discussed previously with respect to block S31 of the method M3. Thereafter, in block S42 of the method M4, the photomask MA is moved such that an identified particle P2 on the photomask MA associated with an identified particle location PL2 in the particle map PM2 (as shown in FIG. 29) is moved to a position vertically below the cleaner 620, as illustrated in FIG. 31 where the photomask MA is moved horizontally (indicated by the arrow D41). Movement of the photomask MA can be performed using the reticle gripper 540, as discussed previously with respect to block S32 of the method M3.

Figure 32:
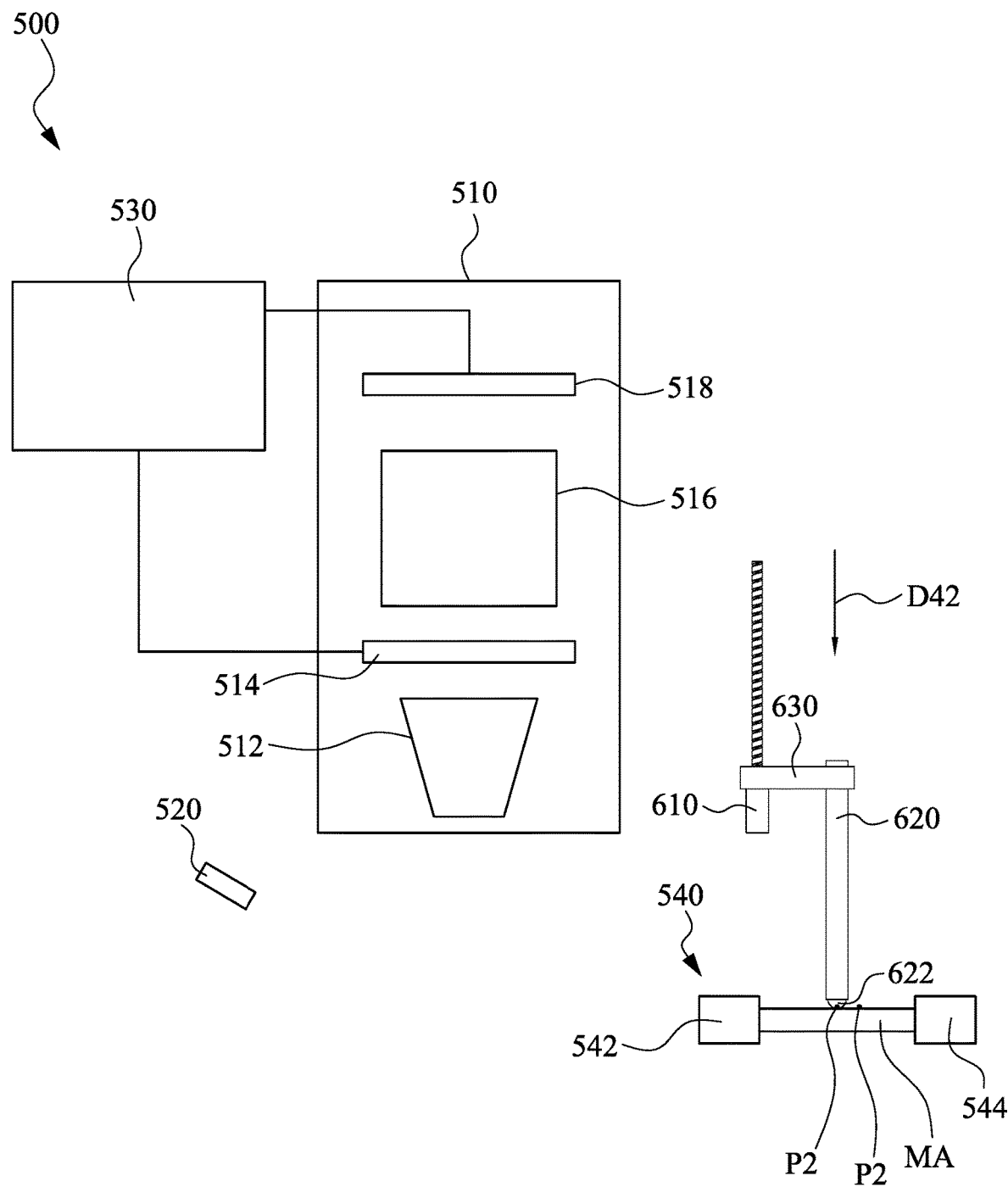
Figure 33:
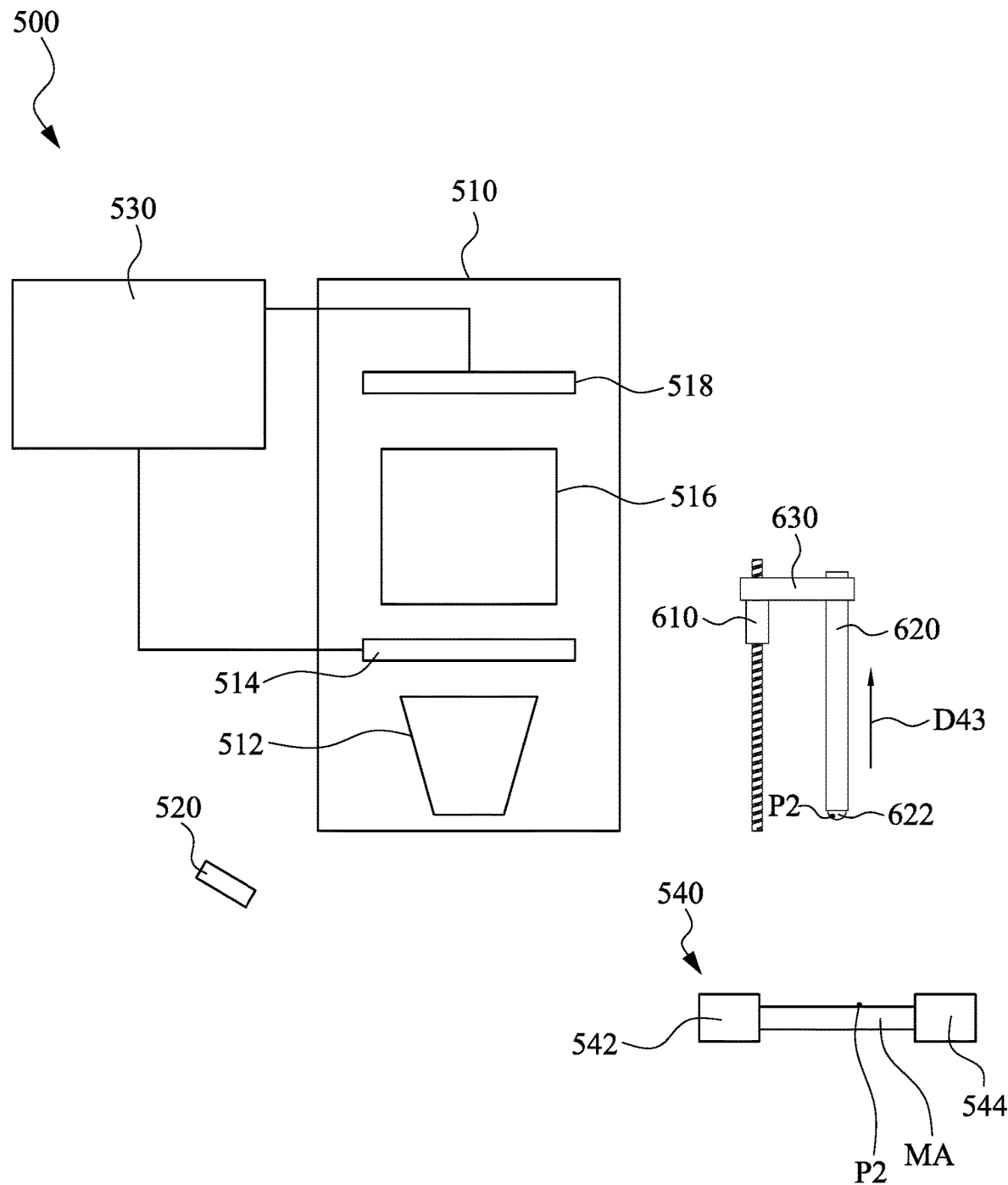

Afterwards, in block S43 of the method M4, the cleaner 620 is lowered until reaching the identified particle P2 on the photomask MA, as illustrated in FIG. 32 where the cleaner 620 is moved downwards (indicated by the arrow D42). Lowering the cleaner 620 can be performed using the motion actuator 610, as discussed previously with respect to block S33 of the method M3. Thereafter, in block S44 of the method M4, the cleaner 620 is lifted so as to lift the particle P2 away from the photomask MA, as illustrated in FIG. 33 where the cleaner 620 is moved upwards (indicated by the arrow D43).

Figure 34:
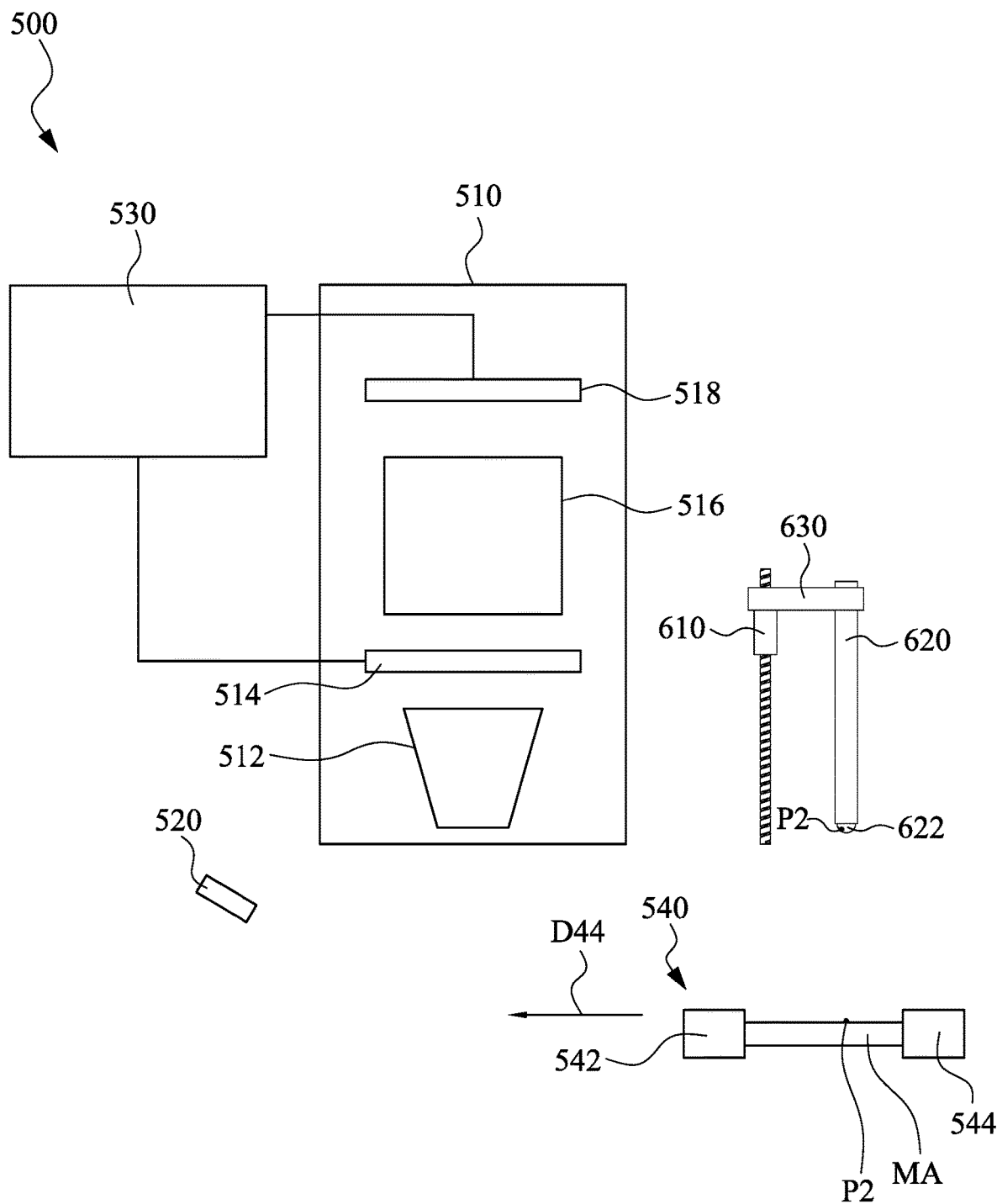
Figure 35:
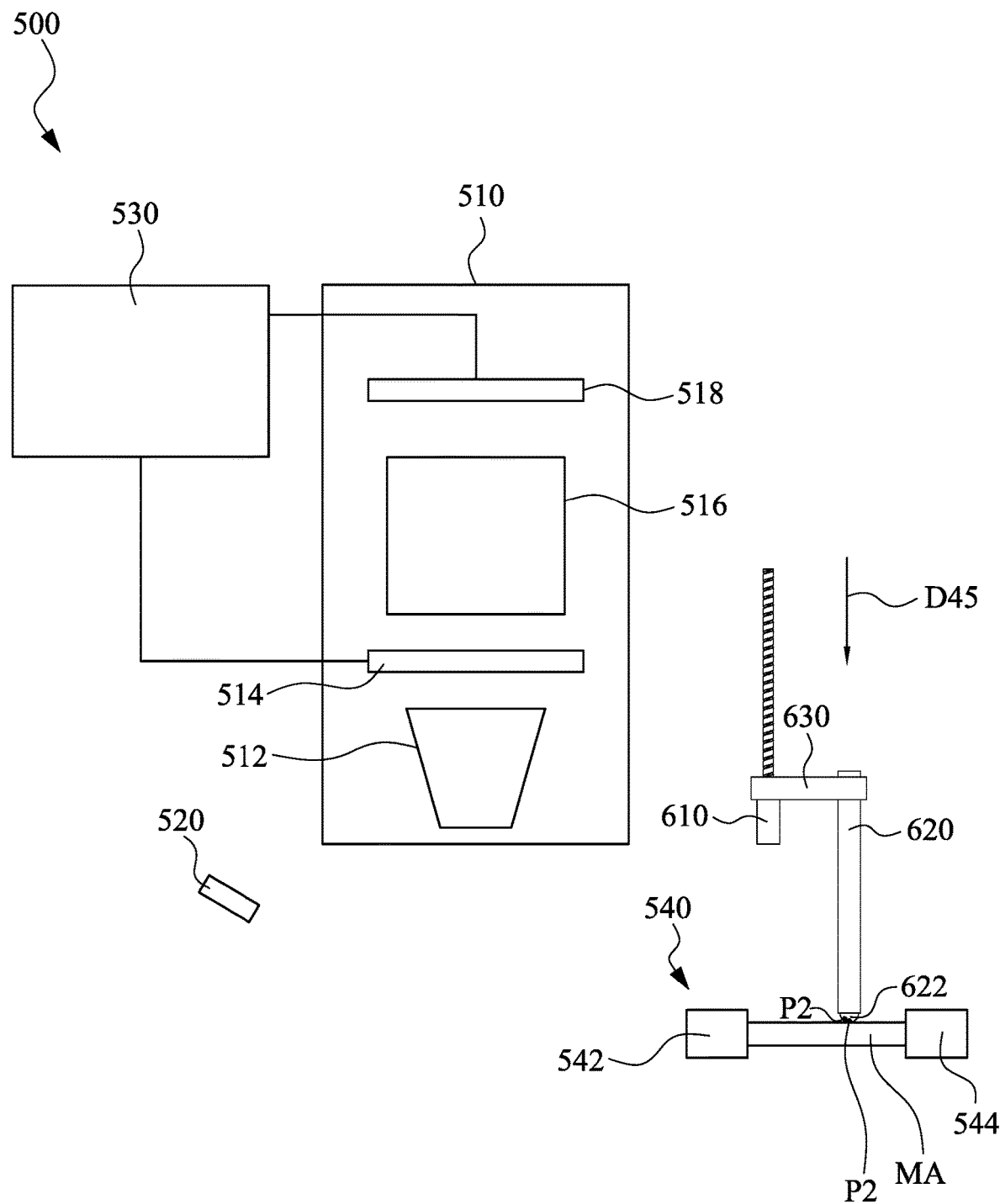
Figure 36:
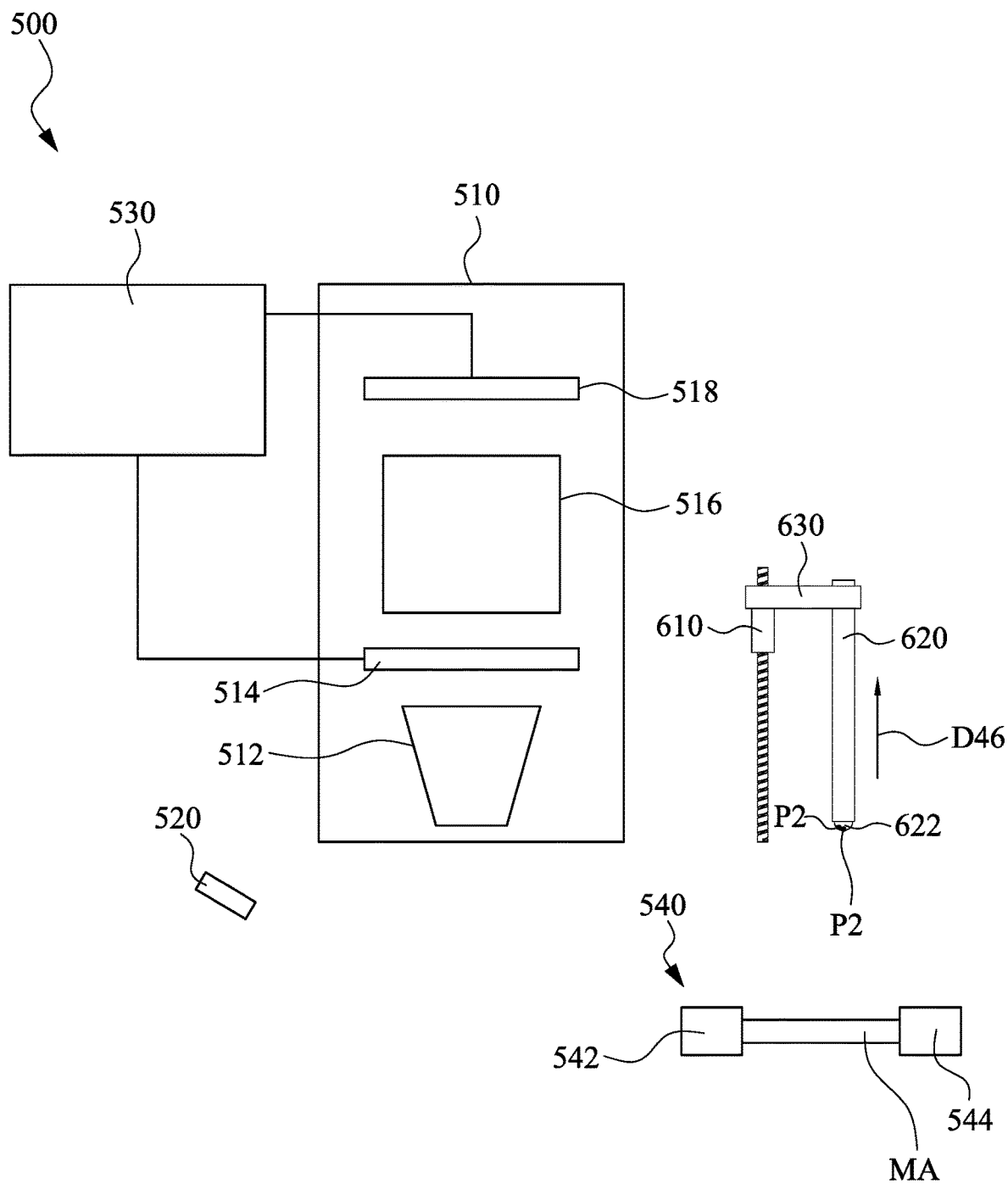

The method M4 then proceeds back to block S42 where the photomask MA is moved such that another identified particle P2 on the photomask MA, associated with another identified particle location PL2 in the particle map PM2, is moved to the position vertically below the cleaner 620, as illustrated in FIG. 34 where the photomask MA is moved horizontally (indicated by the arrow D44). Afterwards, the method M4 proceeds to blocks S43 where the cleaner 620 is lowered until reaching the another identified particle P2 on the photomask MA, as illustrated in FIG. 35 where the cleaner 620 is moved downwards (indicated by the arrow D45). Thereafter, in block S44 of the method M4, the cleaner 620 is lifted so as to lift the another particle P2 away from the photomask MA, as illustrated in FIG. 36 where the cleaner 620 is moved upwards (indicated by the arrow D46).

Blocks S42, S43 and S44 in the method M4 are in combination serve as a cyclic operation. After one or more repetitions of the cyclic operation to remove all identified particles from the photomask MA, the method M4 proceeds to block S45 where the photomask MA can be moved to the photomask table (e.g., the photomask table 150 as shown in FIG. 1) in a lithographic apparatus. Afterwards, in block S46 of method M4, a lithography process is performed to a wafer (e.g., the wafer W as shown in FIG. 1) using the photomask MA.

In some embodiments of method M4, the photomask MA remains stationary when the sticky structure 622 is in contact with the photomask MA. As a result, the sticky structure 622 might not roll because of lack of horizontal movement of the photomask MA. As a result, in some embodiments of the present disclosure, the cleaner 620 may be replaced with the cleaner 320d that is capable of actively rolling the sticky structure 322 thereof, as illustrated in FIG. 22. In greater detail, after lifting the cleaner 320d adhered with a particle P2 from the photomask MA (block S44), the first rotation actuator 327 and/or the second rotation actuator 329 rotates the sticky structure 322, so that the particle P2 adhered to the sticky structure 322 can be rotated upwardly. As a result, when the cleaner 320d is lowered again to another particle P2, it will be adhered to a cleaning area on the sticky structure 322 that is free from the pre-adhered particle P2.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that particles on the wafer table and/or photomask can be adhered to the sticky structure and thus removed from the wafer table and/or photomask when the sticky structure is lifted. Another advantage is that the particle removal performance can be improved by heating the sticky structure and/or by inducing resonance of particles. Yet another advantage is that cleaning of the sticky structure can be achieved using a cleaning tool (e.g., a scrapper having a tool tip in contact with the sticky structure). Yet another advantage is that the sticky structure can be precisely rotated to various orientations using rotation actuators rotatable along non-parallel axes, so that particles can be adhered to different portions of the sticky surface.

In some embodiments, a method includes moving a sticky structure to a wafer table such that a first particle on the wafer table is adhered to the sticky structure, moving the sticky structure away from the wafer table after the first particle is adhered to the sticky structure, and performing a lithography process to a wafer held by the wafer table after moving the sticky structure away from the wafer table.

In some embodiments, the method further includes inducing resonance of the first particle when the first particle is on the wafer table.

In some embodiments, moving the sticky structure to the wafer table is performed such that the sticky structure is in contact with the wafer table, and the method further includes heating the sticky structure when the sticky structure is in contact with the wafer table.

In some embodiments, moving the sticky structure to the wafer table includes moving a cantilever downwards along a vertically extending guide, wherein the sticky structure is fixed to the cantilever.

In some embodiments, moving the sticky structure away from the wafer table includes moving a cantilever upwards along a vertically extending guide, wherein the sticky structure is fixed to the cantilever.

In some embodiments, moving the sticky structure to the wafer table is performed such that the sticky structure is in contact with the wafer table, and the method further includes horizontally moving the wafer table when the sticky structure is in contact with the wafer table, wherein horizontally moving the wafer table is performed such that the sticky structure is rolled.

In some embodiments, rolling the sticky structure is performed such that the first particle is scratched away from the sticky structure.

In some embodiments, the method further includes after moving the sticky structure away from the wafer table, moving the sticky structure back to the wafer table such that a second particle on the wafer table is adhered to the sticky structure.

In some embodiments, the method further includes rotating the sticky structure after moving the sticky structure away from the wafer table, and adhering a second particle on the wafer table to the sticky structure after rotating the sticky structure.

In some embodiments, a method includes moving a photomask such that a first particle on the photomask is under a sticky structure, moving the sticky structure to the photomask until the first particle is adhered to the sticky structure, moving the sticky structure away from the photomask after the first particle is adhered to the sticky structure, and performing a lithography process using the photomask after lifting the sticky structure.

In some embodiments, the method further includes vibrating the first particle when the first particle is on the photomask.

In some embodiments, the method further includes heating the first particle when the first particle is on the photomask.

In some embodiments, the sticky structure is lowered such that the sticky structure is in contact with the photomask, and the method further includes horizontally moving the photomask when the sticky structure is in contact with the photomask, wherein horizontally moving the photomask rolls the sticky structure.

In some embodiments, rolling the sticky structure is performed such that the first particle is detached from the sticky structure.

In some embodiments, the method further includes moving the sticky structure to the photomask after moving the sticky structure away from the photomask until a second particle on the photomask is adhered to the sticky structure.

In some embodiments, the method further includes rotating the sticky structure after moving the sticky structure away from the photomask, and adhering a second particle on the photomask to the sticky structure after rotating the sticky structure.

In some embodiments, a lithographic apparatus includes a projection lens, a sticky structure and a holding movable between a position under the projection lens and a position under the sticky structure. The sticky structure is movable along a direction non-parallel with a top surface of the holding device.

In some embodiments, the lithographic apparatus further includes a heater thermally coupled to the sticky structure.

In some embodiments, the lithographic apparatus further includes a cleaning tool having a tip in contact with the sticky structure.

In some embodiments, the lithographic apparatus further includes a first rotation actuator in contact with the sticky structure and rotatable about a first axis, and a second rotation actuator in contact with the sticky structure and rotatable about a second axis non-parallel with the first axis.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   inspecting, using a level sensor disposed on a bottom side of a frame, heights of different regions on a wafer table to generate a particle map;
   laterally moving the wafer table to a position directly under an opening extending through the bottom side and a top side of the frame;
   vertically moving a sticky structure downwardly through the opening to the wafer table such that a first particle directly on the wafer table is adhered to the sticky structure;
   moving the sticky structure away from the wafer table after the first particle is adhered to the sticky structure; and
   performing a lithography process to a wafer held by the wafer table after moving the sticky structure away from the wafer table.

2. The method of claim 1, further comprising:
   inducing resonance of the first particle when the first particle is on the wafer table.

3. The method of claim 1, wherein moving the sticky structure to the wafer table is performed such that the sticky structure is in contact with the wafer table, and the method further comprises:
   heating the sticky structure when the sticky structure is in contact with the wafer table.

4. The method of claim 1, wherein moving the sticky structure to the wafer table comprises:
   moving a cantilever downwards along a vertically extending guide, wherein the sticky structure is fixed to the cantilever.

5. The method of claim 1, wherein moving the sticky structure away from the wafer table comprises:
   moving a cantilever upwards along a vertically extending guide, wherein the sticky structure is fixed to the cantilever.

6. The method of claim 1, wherein moving the sticky structure to the wafer table is performed such that the sticky structure is in contact with the wafer table, and the method further comprises:
   horizontally moving the wafer table when the sticky structure is in contact with the wafer table, wherein horizontally moving the wafer table is performed such that the sticky structure is rolled.

7. The method of claim 6, wherein rolling the sticky structure is performed such that the first particle is scratched away from the sticky structure.

8. The method of claim 1, further comprising:
   after moving the sticky structure away from the wafer table, moving the sticky structure back to the wafer table such that a second particle on the wafer table is adhered to the sticky structure.

9. The method of claim 1, further comprising:
   rotating the sticky structure after moving the sticky structure away from the wafer table; and
   adhering a second particle on the wafer table to the sticky structure after rotating the sticky structure.

10. A method, comprising:
    inspecting a reticle to generate a particle map by focusing a radiation beam on the reticle and receiving a reflected beam from the reticle;
    moving the reticle, in response to the particle map, such that a first particle on the reticle is under a sticky structure;
    moving the sticky structure to the reticle until the first particle on the reticle is adhered to the sticky structure;
    moving the sticky structure away from the reticle after the first particle is adhered to the sticky structure; and
    performing a lithography process using the reticle after lifting the sticky structure.

11. The method of claim 10, further comprising:
    vibrating the first particle when the first particle is on the reticle.

12. The method of claim 10, further comprising:
    heating the first particle when the first particle is on the reticle.

13. The method of claim 10, wherein the sticky structure is lowered such that the sticky structure is in contact with the reticle, and the method further comprises:
    horizontally moving the reticle when the sticky structure is in contact with the reticle, wherein horizontally moving the reticle rolls the sticky structure.

14. The method of claim 13, wherein rolling the sticky structure is performed such that the first particle is detached from the sticky structure.

15. The method of claim 10, further comprising:
    moving the sticky structure to the reticle after moving the sticky structure away from the reticle until a second particle on the reticle is adhered to the sticky structure.

16. The method of claim 10, further comprising:
    rotating the sticky structure after moving the sticky structure away from the reticle; and
    adhering a second particle on the reticle to the sticky structure after rotating the sticky structure.

17. A photomask inspection system, comprising:
    a projection lens;
    a light detector on a backside of the projection lens, the light detector and the projection lens being arranged along a vertical direction;
    a light source operable to emit a light beam along an optical path tilted with respect to the vertical direction;
    a linear motor spaced apart from the projection lens along a horizontal direction and having a cantilever movable along the vertical direction;
    a sticky structure disposed on the cantilever; and
    a reticle gripper movable between a position under the projection lens and a position under the sticky structure along the horizontal direction.

18. The photomask inspection system of claim 17, further comprising:
    a heater thermally coupled to the sticky structure.

19. The photomask inspection system of claim 18, further comprising:
    a cleaning tool having a tip in contact with the sticky structure.

20. The photomask inspection system of claim 17, further comprising:
    a first rotation actuator in contact with the sticky structure and rotatable about a first axis; and
    a second rotation actuator in contact with the sticky structure and rotatable about a second axis non-parallel with the first axis.

* * * * *